United States Patent
Hirose et al.

(10) Patent No.: US 10,340,134 B2
(45) Date of Patent: Jul. 2, 2019

(54) SEMICONDUCTOR DEVICE MANUFACTURING METHOD, SUBSTRATE PROCESSING APPARATUS, AND RECORDING MEDIUM

(71) Applicant: HITACHI KOKUSAI ELECTRIC INC., Tokyo (JP)

(72) Inventors: Yoshiro Hirose, Toyama (JP); Atsushi Sano, Toyama (JP); Katsuyoshi Harada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/627,828

(22) Filed: Jun. 20, 2017

(65) Prior Publication Data

US 2017/0294302 A1 Oct. 12, 2017

Related U.S. Application Data

(63) Continuation of application No. PCT/JP2014/083880, filed on Dec. 22, 2014.

(51) Int. Cl.
*C23C 16/30* (2006.01)
*H01L 21/02* (2006.01)
(Continued)

(52) U.S. Cl.
CPC ........ *H01L 21/02112* (2013.01); *C23C 16/30* (2013.01); *C23C 16/452* (2013.01);
(Continued)

(58) Field of Classification Search
CPC .......... H01L 21/02126; H01L 21/0228; H01L 21/0214; H01L 21/0217
See application file for complete search history.

(56) References Cited

U.S. PATENT DOCUMENTS

| 2013/0237064 A1 | 9/2013 | Kirikihira et al. |
| 2013/0252439 A1* | 9/2013 | Hirose .................... C23C 16/30 438/778 |

(Continued)

FOREIGN PATENT DOCUMENTS

| JP | 2013-187507 A | 9/2013 |
| JP | 2013-225660 A | 10/2013 |

(Continued)

OTHER PUBLICATIONS

W.F.Kane (et al.), Use of SiBN and SiBON Films Prepared by Plasma Enhanced Chemical Vapor Deposition from Borazine as Interconnection Dielectrics, Journal of The Electrochemical Society, 1997, vol. 144, issue 2, p. 658-663.

(Continued)

*Primary Examiner* — Charles D Garber
*Assistant Examiner* — Xiaoming Liu
(74) *Attorney, Agent, or Firm* — Volpe and Koenig, P.C.

(57) ABSTRACT

A method includes forming a film on a substrate by performing a cycle n times (where n is an integer equal to or greater than 1), the cycle including alternately performing: performing a set m times (where m is an integer equal to or greater than 1), the set including supplying a precursor to the substrate and supplying a borazine compound to the substrate; and supplying an oxidizing agent to the substrate.

15 Claims, 8 Drawing Sheets

(51) Int. Cl.
*C23C 16/455* (2006.01)
*C23C 16/452* (2006.01)

(52) U.S. Cl.
CPC .. *C23C 16/45531* (2013.01); *C23C 16/45536* (2013.01); *H01L 21/0228* (2013.01); *H01L 21/0234* (2013.01); *H01L 21/02126* (2013.01); *H01L 21/02205* (2013.01); *H01L 21/02211* (2013.01); *H01L 21/02274* (2013.01); *H01L 21/02323* (2013.01)

(56) References Cited

U.S. PATENT DOCUMENTS

| | | | |
|---|---|---|---|
| 2013/0260576 A1* | 10/2013 | Kadonaga | H01L 21/0226 438/791 |
| 2014/0051261 A1 | 2/2014 | Ota et al. | |
| 2014/0073142 A1 | 3/2014 | Hirose et al. | |
| 2014/0170858 A1 | 6/2014 | Harada et al. | |

FOREIGN PATENT DOCUMENTS

| | | | |
|---|---|---|---|
| JP | 2014-056871 A | 3/2014 | |
| JP | 2014-135475 A | 7/2014 | |
| JP | 2014-168070 A | 9/2014 | |
| JP | 2014-220468 A | 11/2014 | |

OTHER PUBLICATIONS

International Search Report for WO 2016/103317 A1, dated Mar. 10, 2015.
Office Action in JP counterpart Application No. 2016-565616 dated Sep. 27, 2017.

* cited by examiner

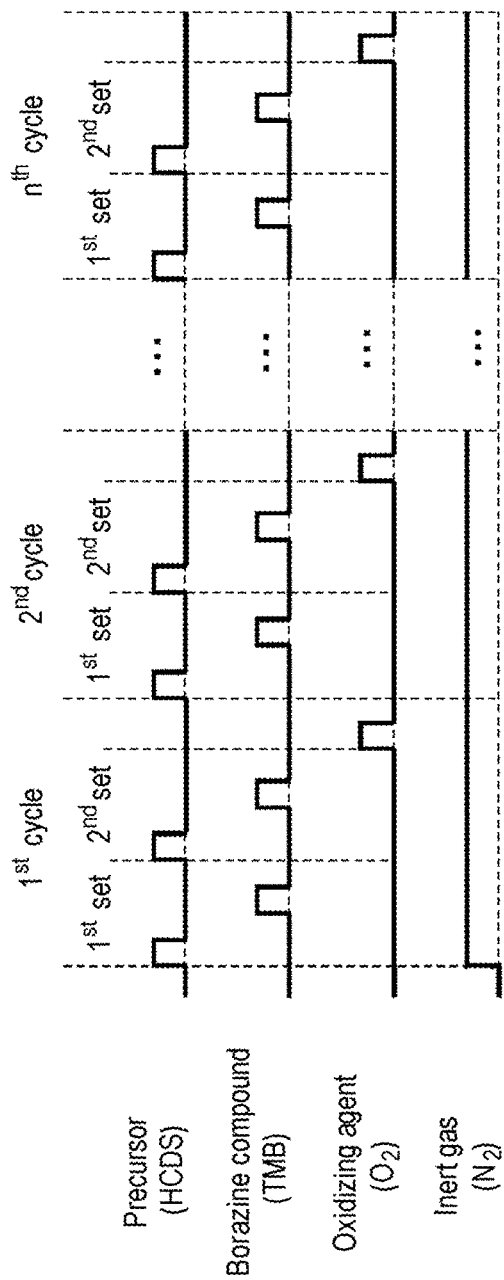

SEMICONDUCTOR DEVICE MANUFACTURING METHOD, SUBSTRATE PROCESSING APPARATUS, AND RECORDING MEDIUM

CROSS-REFERENCE TO RELATED APPLICATION

This application is a bypass continuation application of international application No. PCT/JP2014/083880 having an international filing date of Dec. 22, 2014 and designating the United States, the entire contents of which are incorporated herein by reference.

TECHNICAL FIELD

The present disclosure relates to a method of manufacturing a semiconductor device, a substrate processing apparatus, and a recording medium.

BACKGROUND

As one process of manufacturing a semiconductor device, a process is often carried out for forming a multi-element film containing boron (B), nitrogen (N) and a predetermined element (silicon (Si), a metal element, or the like), or a multi-component film containing B, N, carbon (C) and a predetermined element on a substrate.

SUMMARY

The present disclosure provides some embodiments of a technique capable of enhancing controllability of a composition ratio or a quality of a multi-element film formed on a substrate.

According to one embodiment of the present disclosure, there is provided a method of manufacturing a semiconductor device, including: forming a film on a substrate by performing a cycle n times (where n is an integer equal to or greater than 1), the cycle including alternately performing: performing a set m times (where m is an integer equal to or greater than 1), the set including supplying a precursor to the substrate and supplying a borazine compound to the substrate; and supplying an oxidizing agent to the substrate.

According to the present disclosure, it is possible to enhance controllability of a composition ratio or a quality of a multi-component film formed on a substrate.

BRIEF DESCRIPTION OF THE DRAWINGS

FIG. 4C is a diagram illustrating a gas supply timing of modification 2 of the film forming sequence according to one embodiment of the present disclosure.

DETAILED DESCRIPTION

One Embodiment of the Present Disclosure

One embodiment of the present disclosure will now be described in detail with reference to FIGS. 1 to 3.

(1) Configuration of the Substrate Processing Apparatus

Figure 1:
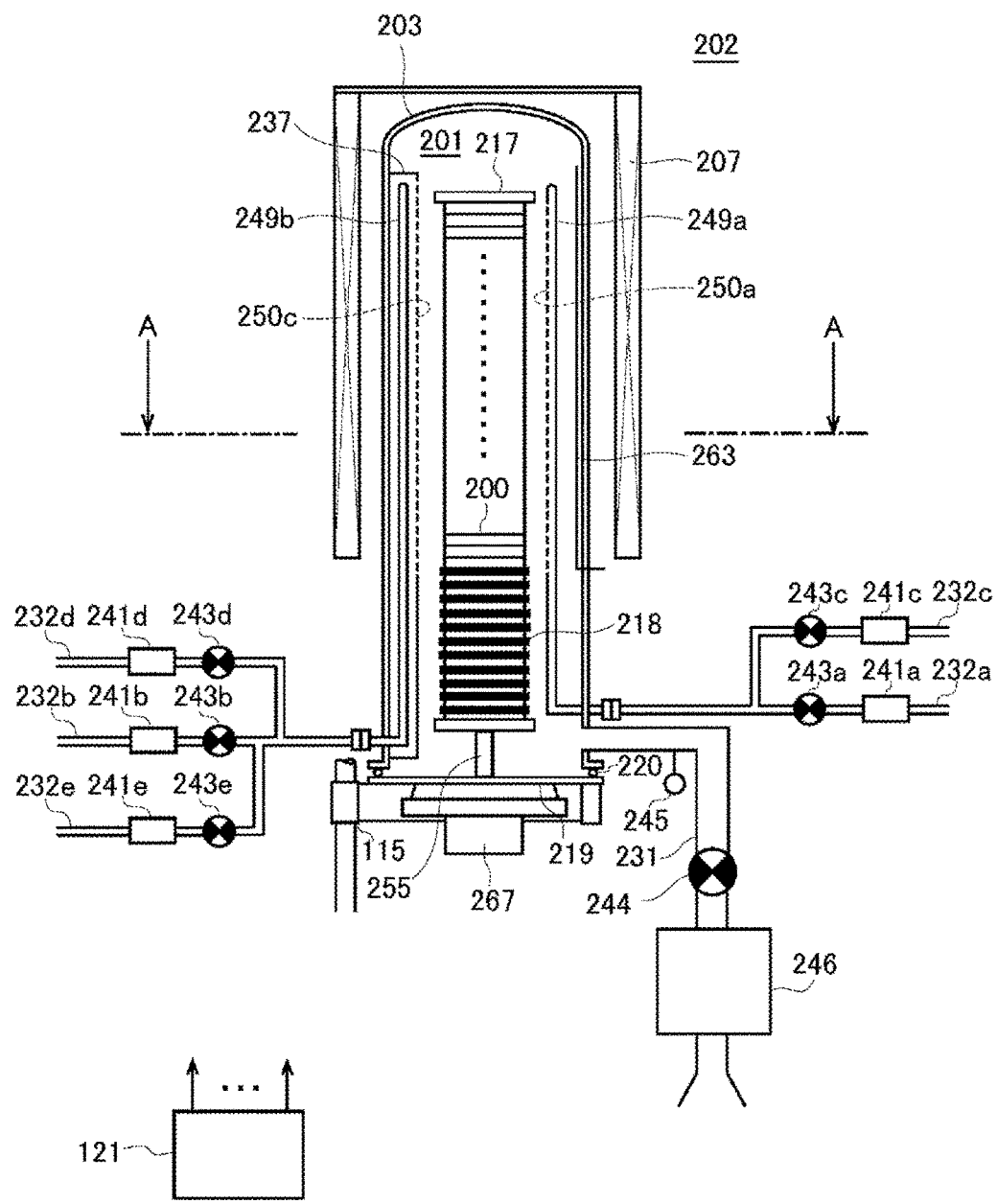
FIG. 1 is a schematic configuration diagram of a vertical type processing furnace of a substrate processing apparatus suitably used in one embodiment of the present disclosure, in which a portion of the processing furnace is shown in a vertical cross sectional view.

As illustrated in FIG. 1, a processing furnace 202 includes a heater 207 as a heating means (heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 constituting a reaction vessel (process vessel) is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates in a state that the wafers 200 are horizontally stacked at multiple stages along a vertical direction in a boat 217 which will be described later.

Nozzles 249a and 249b are installed in the process chamber 201 so as to penetrate a lower sidewall of the reaction tube 203. The nozzles 249a and 249b are made of a heat resistant material such as quartz or SiC. Gas supply pipes 232a and 232b are respectively connected to the nozzles 249a and 249b. Gas supply pipes 232e are connected to the gas supply pipe 232b. In this way, the two nozzles 249a and 249b and the three gas supply pipes 232a, 232b and 232e are installed in the reaction tube 203 and are capable of supplying plural types of gases into the process chamber 201.

However, the processing furnace 202 of the present embodiment is not limited to the one mentioned above. For example, a manifold made of metal and configured to support the reaction tube 203 may be installed under the reaction tube 203, and each nozzle may be installed to penetrate a sidewall of the manifold. In this case, an exhaust pipe 231, which will be described later, may be further installed in the manifold. Even in this case, the exhaust pipe 231 may be installed not under the manifold but under the reaction tube 203. In this manner, a furnace opening portion of the processing furnace 202 may be made of metal, and the nozzles or the like may be attached to the furnace opening portion made of metal.

Mass flow controllers (MFCs) 241a, 241b and 241e, which are flow rate controllers (flow rate control parts), and valves 243a, 243b and 243e, which are opening/closing valves, are installed in the gas supply pipes 232a, 232b and 232e sequentially from the corresponding upstream sides, respectively. Gas supply pipes 232c and 232d, which supply an inert gas, are respectively connected to the gas supply pipes 232a and 232b at the downstream sides of the valves 243a and 243b. MFCs 241c and 241d and valves 243c and 243d are respectively installed in the gas supply pipes 232c and 232d sequentially from the corresponding upstream sides.

The nozzle 249a is connected to a front end portion of the gas supply pipe 232a. As illustrated in FIG. 2, the nozzle 249a is disposed in a space having an annular shape between the inner wall of the reaction tube 203 and the wafers 200 such that the nozzle 249a extends upward along an arrangement direction of the wafers 200 from a lower portion of the inner wall of the reaction tube 203 to an upper portion of the inner wall of the reaction tube 203. Specifically, the nozzle 249a is installed in a region horizontally surrounding a wafer arrangement region in which the wafers 200 are arranged at a lateral side of the wafer arrangement region, along the wafer arrangement region. That is, the nozzle 249a is installed in a perpendicular relationship with the surfaces (flat surfaces) of the wafers 200 at a lateral side of the end portions (peripheral edge portions) of the wafers 200 which are carried into the process chamber 201. The nozzle 249a is configured as an L-shaped nozzle. A horizontal portion of the nozzle 249a is installed to penetrate a lower sidewall of the reaction tube 203. A vertical portion of the nozzle 249a is installed to extend upward at least from one end portion of the wafer arrangement region toward the other end portion of the wafer arrangement region. Gas supply holes 250a for supplying a gas are formed on the side surface of the nozzle 249a. The gas supply holes 250a are opened toward the center of the reaction tube 203 to allow a gas to be supplied toward the wafers 200. A plurality of gas supply holes 250a may be formed between the lower portion of the reaction tube 203 and the upper portion of the reaction tube 203. The respective gas supply holes 250a may be formed to have the same aperture area at the same aperture pitch.

The nozzle 249b is connected to a front end portion of the gas supply pipe 232b. The nozzle 249b is installed within a buffer chamber 237. The buffer chamber 237 also functions as a gas diffusion space. The buffer chamber 237 is installed in a space having an annular shape between the inner wall of the reaction tube 203 and the wafers 200 such that the buffer chamber 237 extends along the arrangement direction of the wafers 200 from the lower portion of the inner wall of the reaction tube 203 to the upper portion of the inner wall of the reaction tube 203. That is, the buffer chamber 237 is installed in a region horizontally surrounding the wafer arrangement region at the lateral side of the wafer arrangement region, along the wafer arrangement region. In other words, the buffer chamber 237 is installed at the lateral side of the end portions of the wafers 200 which are carried into the process chamber 201. Gas supply holes 250c for supplying a gas are formed in an end portion of the wall of the buffer chamber 237 which adjoins the wafers 200. The gas supply holes 250c are opened toward the center of the reaction tube 203 to allow a gas to be supplied toward the wafers 200. A plurality of gas supply holes 250c may be formed between the lower portion of the reaction tube 203 and the upper portion of the reaction tube 203. The respective gas supply holes 250c may be formed to have the same aperture area at the same aperture pitch.

The nozzle 249b is installed in an end portion of the buffer chamber 237, which is opposite to the end portion of the buffer chamber 237 in which the gas supply holes 250c is installed, such that the nozzle 249b extends upward along the arrangement direction of the wafers 200 from the lower portion of the inner wall of the reaction tube 203 to the upper portion of the reaction tube 203. Specifically, the nozzle 249b is installed in a region horizontally surrounding the wafer arrangement region in which the wafers 200 are arranged at the lateral side of the wafer arrangement region, along the wafer arrangement region. That is, the nozzle 249b is installed in a perpendicular relationship with the surfaces of the wafers 200 at the lateral side of the end portions of the wafers 200 which are carried into the process chamber 201. The nozzle 249b is configured as an L-shaped nozzle. A horizontal portion of the nozzle 249b is installed to penetrate the lower sidewall of the reaction tube 203. A vertical portion of the nozzle 249b is installed to extend upward at least from one end portion of the wafer arrangement region toward the other end portion of the wafer arrangement region. Gas supply holes 250b for supplying a gas are formed on the side surface of the nozzle 249b. The gas supply holes 250b are opened toward the center of the buffer chamber 237. Similar to the gas supply holes 250c, a plurality of gas supply holes 250b may be formed between the lower portion of the reaction tube 203 and the upper portion of the reaction tube 203. In the case where the differential pressure between the interior of the buffer chamber 237 and the interior of the process chamber 201 is small, the aperture area and the aperture pitch of the gas supply holes 250b may be respectively set to remain constant between the upstream side (lower portion) and the downstream side (upper portion) of the nozzle 249b. In the case where the differential pressure between the interior of the buffer chamber 237 and the interior of the process chamber 201 is large, the aperture area of the gas supply holes 250b may be set to become gradually larger from the upstream side toward the downstream side of the nozzle 249b, or the aperture pitch of the gas supply holes 250b may be set to become gradually smaller from the upstream side toward the downstream side of the nozzle 249b.

By adjusting the aperture area or the aperture pitch of the gas supply holes 250b between the upstream side and the downstream side as mentioned above, it is possible to inject a gas from the gas supply holes 250b at different flow velocities but at a substantially equal flow rate. The gas injected from the respective gas supply holes 250b is first introduced into the buffer chamber 237. This makes it possible to equalize the flow velocities of the gas within the buffer chamber 237. The gas injected from the respective gas supply holes 250b into the buffer chamber 237 is injected from the gas supply holes 250c into the process chamber 201 after the particle velocity of the gas is relaxed within the buffer chamber 237. The gas injected from the respective gas supply holes 250b into the buffer chamber 237 has a uniform flow rate and a uniform flow velocity when injected from the respective gas supply holes 250c into the process chamber 201.

As described above, in the present embodiment, a gas is transferred through the nozzles 249a and 249b and the buffer chamber 237, which are disposed in a vertically-elongated space with an annular shape, i.e., a cylindrical space, defined by the inner surface of the sidewall of the reaction tube 203 and the end portions (peripheral edge portions) of the wafers 200 arranged within the reaction tube 203. The gas is initially injected into the reaction tube 203, near the wafers 200, through the gas supply holes 250a to 250c respectively formed in the nozzles 249a and 249b and the buffer chamber 237. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the uniformity in the thickness of a thin film formed on each of the wafers 200. In addition, the gas flowing on the surfaces of the wafers 200 after the reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A precursor gas containing a predetermined element, for example, a halosilane precursor gas containing silicon (Si) as the predetermined element and a halogen element, is supplied from the gas supply pipe 232a into the process chamber 201 via the MFC 241a, the valve 243a and the nozzle 249a.

The halosilane precursor gas refers to a gaseous halosilane precursor, for example, a gas obtained by vaporizing a halosilane precursor which remains in a liquid state under room temperature and atmospheric pressure, or a halosilane precursor which remains in a gas state under room temperature and atmospheric pressure. The halosilane precursor refers to a silane precursor having a halogen group. The halogen group includes a chloro group, a fluoro group, a bromo group, an iodo group and the like. That is, the halogen group contains halogen elements such as chlorine (Cl), fluorine (F), bromine (Br), iodine (I) and the like. The halosilane precursor may be said to be a kind of halide. When the term "precursor" is used herein, it may refer to "a liquid precursor staying in a liquid state," "a precursor gas staying in a gaseous state," or both.

Figure 5A:
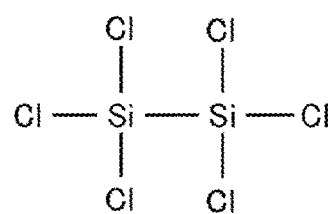
FIG. 5A is a diagram illustrating a chemical structural formula of HCDS and FIG. 5B is a diagram illustrating a chemical structural formula of OCTS.
Figure 5B:
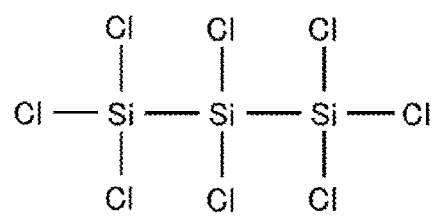

As the halosilane precursor gas, it may be possible to use, for example, a C-free precursor gas which contains Si and Cl, i.e., an inorganic chlorosilane precursor gas. As the inorganic chlorosilane precursor gas, it may be possible to use, for example, a hexachlorodisilane ($Si_2Cl_6$, abbreviation: HCDS) gas, an octachlorotrisilane ($Si_3Cl_8$, abbreviation: OCTS) gas or the like. FIG. 5A illustrates a chemical structural formula of HCDS and FIG. 5B illustrates a chemical structural formula of OCTS. These gases may be referred to as precursor gases which contain at least two Si atoms in one molecule and further Cl, and which have an Si—Si bond. These gases act as Si sources in a film forming process which will be described later.

Figure 6A:
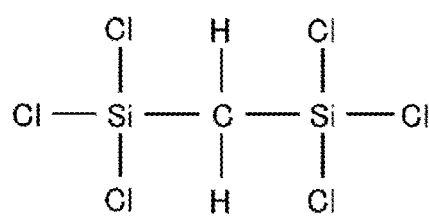
FIG. 6A is a diagram illustrating a chemical structural formula of BTCSM and FIG. 6B is a diagram illustrating a chemical structural formula of BTCSE.
Figure 6B:
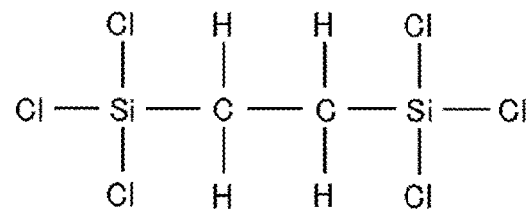

In addition, as the halosilane precursor gas, it may be possible to use, for example, a precursor gas which contains Si, Cl and an alkylene group and which has a Si—C bond, i.e., an alkylene chlorosilane precursor gas which is an organic chlorosilane precursor gas. The alkylene group includes a methylene group, an ethylene group, a propylene group, a butylene group and the like. The alkylene chlorosilane precursor gas may be referred to as an alkylene halosilane precursor gas. As the alkylene halosilane precursor gas, it may be possible to use, for example, a bis(trichlorosilyl)methane (($SiCl_3)_2CH_2$, abbreviation: BTCSM) gas, an ethylene bis (trichlorosilane) gas, i.e., a 1,2-bis(trichlorosilyl)ethane (($SiCl_2)_2C_2H_4$, abbreviation: BTCSE) gas or the like. FIG. 6A illustrates a chemical structural formula of BTCSM and FIG. 6B illustrates a chemical structural formula of BTCSE. These gases may be said to be precursor gases which contain at least two Si atoms in one molecule and also contain C and Cl, and which have Si—C bonds. These gases act as Si sources and also as C sources in the film forming process which will be described later.

Figure 7A:
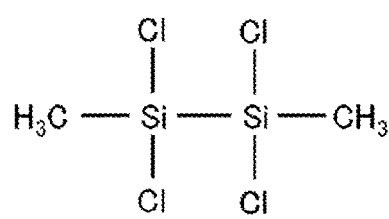
FIG. 7A is a diagram illustrating a chemical structural formula of TCDMDS.
Figure 7B:
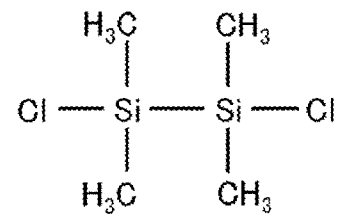
FIG. 7B is a diagram illustrating a chemical structural formula of DCTMDS.
Figure 7C:
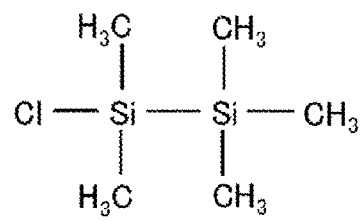
FIG. 7C is a diagram illustrating a chemical structural formula of MCPMDS.

Furthermore, as the halosilane precursor gas, it may be possible use, for example, a precursor gas which contains Si, Cl and an alkyl group, and which has Si—C bonds, i.e., an alkylchlorosilane precursor gas which is an organic chlorosilane precursor gas. The alkyl group includes a methyl group, an ethyl group, a propyl group, a butyl group and the like. The alkylchlorosilane precursor gas may be referred to as an alkylhalosilane precursor gas. As the alkylchlorosilane precursor gas, it may be possible use, for example, a 1,1,2,2-tetrachloro-1,2-dimethyldisilane (($CH_3)_2Si_2Cl_4$, abbreviation: TCDMDS) gas, 1,2-dichloro-1,1,2,2-tetramethyldisilane (($CH_3)_4Si_2Cl_2$, abbreviation: DCTMDS) gas, 1-monochloro-, 1,2,2,2-pentamethyldisilane (($CH_3)_5Si_2Cl$, abbreviation: MCPMDS) gas or the like. FIG. 7A illustrates a chemical structural formula of TCDMDS, FIG. 7B illustrates a chemical structural formula of DCTMDS, and FIG. 7C illustrates a chemical structural formula of MCPMDS. These gases may be referred to as precursor gases which contain at least two Si atoms in one molecule and further contain C and Cl, and which have Si—C bonds. These gases further have a Si—Si bond. These gases act as Si sources and also as C sources in the film forming process which will be described later.

In the case of using a liquid precursor, such as HCDS, BTCSM, TCDMDS or the like, which remains in a liquid state under room temperature and atmospheric pressure, the liquid precursor is vaporized by a vaporization system such as a vaporizer, a bubbler or the like and is supplied as a precursor gas (an HCDS gas, a BTCSM gas, a TCDMDS gas, or the like).

A reaction gas differing in a chemical structure (molecular structure) from the precursor gas, for example, a borazine-based gas which is a boron (B)-containing gas, is supplied from the gas supply pipe 232b into the process chamber 201 via the MFC 241b, the valve 243b, the nozzle 249b and the buffer chamber 237.

As the borazine-based gas, it may be possible to use, for example, a gas containing a borazine ring skeleton and an organic ligand, i.e., an organic borazine-based gas. As the organic borazine-based gas, it may be possible to use a gas obtained by vaporizing an alkyl borazine compound as an organic borazine compound. The organic borazine-based gas may be referred to as a borazine compound or a borazine compound gas.

Figure 8A:
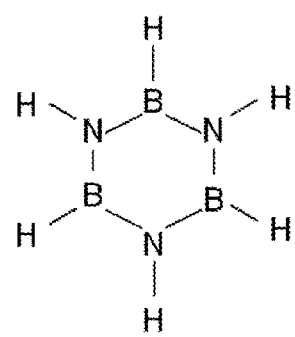
FIG. 8A is a diagram illustrating a chemical structural formula of borazine.
Figure 8B:
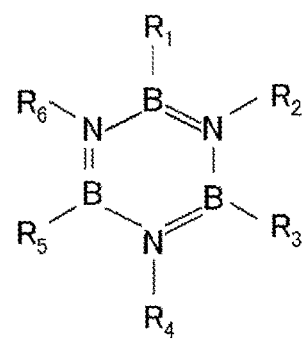
FIG. 8B is a diagram illustrating a chemical structural formula of a borazine compound.

Here, borazine is a heterocyclic compound composed of three elements of B, N, and H, and may be expressed by a composition formula of $B_3H_6N_3$ or a chemical structural formula illustrated in FIG. 8A. The borazine compound is a compound containing a borazine ring skeleton (also referred to as a borazine skeleton) which constitutes a borazine ring composed of three B atoms and three N atoms. The organic borazine compound is a borazine compound containing C and may be a borazine compound which contains a ligand containing C, i.e., an organic ligand. The alkyl borazine compound is a borazine compound containing an alkyl group and may be a borazine compound containing an alkyl group as an organic ligand. The alkyl borazine compound is a compound in which at least one of six H atoms contained in borazine is substituted by a hydrocarbon containing one or more C atoms, and may be expressed by the chemical structural formula illustrated in FIG. 8B. Here, in the chemical structural formula illustrated in FIG. 8B, $R_1$-$R_6$ are alkyl groups containing H or one to four C atoms. $R_1$-$R_6$ may be the same kind of alkyl groups or may be different kinds of alkyl groups. However, a case where $R_1$-$R_6$ are all H is excluded. The alkyl borazine compound may be a material which has a borazine ring skeleton constituting a borazine ring and which contains B, N, H, and C. Furthermore, the alkyl borazine compound may be said to be a material which contains an alkyl ligand having a borazine ring skeleton. In addition, $R_1$-$R_6$ may be alkenyl groups or alkynyl groups containing H or one to four C atoms. $R_1$-$R_6$ may be the same kind of alkenyl groups or alkynyl groups or may be different kinds of alkenyl groups or alkynyl groups. However, a case where $R_1$-$R_6$ are all H is excluded.

The borazine-based gas acts as a B source, an N source, or a C source in the film forming process which will be described later.

Figure 8C:
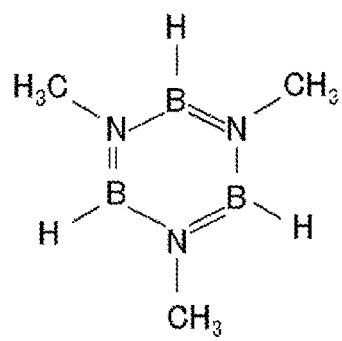
FIG. 8C is a diagram illustrating a chemical structural formula of TMB.
Figure 8D:
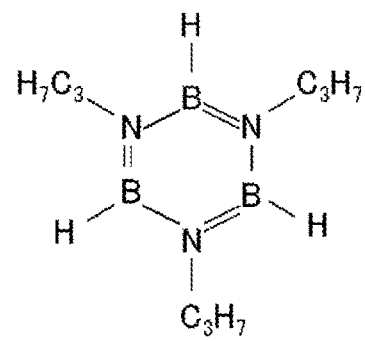
FIG. 8D is a diagram illustrating a chemical structural formula of TPB.

As the borazine-based gas, it may be possible to use, for example, an n, n', n"-trimethylborazine (abbreviation: TMB) gas, an n, n', n"-triethylborazine (abbreviation: TEB) gas, an n, n', n"-tri-n-propylborazine (abbreviation: TPB) gas, an n, n', n"-triisopropylborazine (abbreviation: TIPB) gas, an n, n', n"-tri-n-butylborazine (abbreviation: TBB) gas, an n, n', n"-triisobutylborazine (abbreviation: TIBB) gas or the like. TMB is a borazine compound in which $R_1$, $R_3$, and $R_5$ are H, and $R_2$, $R_4$, and $R_6$ are methyl groups in the chemical structural formula illustrated in FIG. 8B, and which may be expressed by the chemical structural formula illustrated in FIG. 8C. TEB is a borazine compound in which $R_1$, $R_3$, and $R_5$ are H, and $R_2$, $R_4$, and $R_6$ are ethyl groups in the chemical structural formula illustrated in FIG. 8B. TPB is a borazine compound in which $R_1$, $R_3$, and $R_5$ are H, and $R_2$, $R_4$, and $R_6$ are propyl groups in the chemical structural formula illustrated in FIG. 8B, and which may be expressed by the chemical structural formula illustrated in FIG. 8D. TIPB is a borazine compound in which $R_1$, $R_3$, and $R_5$ are H, and $R_2$, $R_4$, and $R_6$ are isopropyl groups in the chemical structural formula illustrated in FIG. 8B. TBB is a borazine compound in which $R_1$, $R_3$, and $R_5$ are H, and $R_2$, $R_4$, and $R_6$ are butyl groups in the chemical structural formula illustrated in FIG. 8B. TIBB is a borazine compound in which $R_1$, $R_3$, and $R_5$ are H, and $R_2$, $R_4$, and $R_6$ are isobutyl groups in the chemical structural formula illustrated in FIG. 8B.

In the case of using a borazine compound such as TMB or the like, which remains in a liquid state under room temperature and atmospheric pressure, the borazine compound of a liquid state is vaporized by a vaporization system such as a vaporizer, a bubbler or the like and is supplied as a borazine-based gas (a TMB gas or the like).

Furthermore, a reaction gas differing in a chemical structure from the precursor gas, for example, an oxygen (O)-containing gas, is supplied from the gas supply pipe 232b into the process chamber 201 via the MFC 241b, the valve 243b, the nozzle 249b and the buffer chamber 237. The O-containing gas acts as an oxidizing agent (oxidizing gas), i.e., an O source, in the film forming process which will be described later. As the O-containing gas, it may be possible to use, for example, an oxygen ($O_2$) gas.

In addition, a reaction gas differing in chemical structure from the precursor gas, for example, a carbon (C)-containing gas, is supplied from the gas supply pipe 232e into the process chamber 201 via the MFC 241e, the valve 243e, the gas supply pipe 232b, the nozzle 249b and the buffer chamber 237. As the C-containing gas, it may be possible to use, for example, a hydrocarbon-based gas. The hydrocarbon-based gas may be a material composed of only two elements of C and H, and acts as a C source in the film formation process which will be described later. As the hydrocarbon-based gas, it may be possible to use, for example, a propylene ($C_3H_6$) gas.

An inert gas, for example, a nitrogen ($N_2$) gas, is supplied from the gas supply pipes 232c and 232d into the process chamber 201 via the respective MFCs 241c and 241d, the respective valves 243c and 243d, the respective gas supply pipes 232a and 232b, the respective nozzles 249a and 249b and the buffer chamber 237.

In the case of supplying the precursor gas from the gas supply pipe 232a, a precursor gas supply system is mainly configured by the gas supply pipe 232a, the MFC 241a, and the valve 243a. The precursor gas supply system may include the nozzle 249a. The precursor gas supply system may be referred to as a precursor supply system. In the case of supplying the halosilane precursor gas from the gas supply pipe 232a, the precursor gas supply system may be referred to as a halosilane precursor gas supply system or a halosilane precursor supply system.

In the case of supplying the B-containing gas from the gas supply pipe 232b, a B-containing gas supply system is mainly configured by the gas supply pipe 232b, the MFC 241b, and the valve 243b. The B-containing gas supply system may include the nozzle 249b and the buffer chamber 237. In the case of supplying the borazine-based gas from the gas supply pipe 232b, the B-containing gas supply system may be referred to as a borazine-based gas supply system, a borazine compound supply system, or a borazine compound gas supply system. Since the borazine-based gas is a gas containing N and C, which is also an N-containing gas or a C-containing gas, the borazine-based gas supply system may be included in a C-containing gas supply system which will be described later.

In the case of supplying the O-containing gas from the gas supply pipe 232b, an O-containing gas supply system is mainly configured by the gas supply pipe 232b, the MFC 241b, and the valve 243b. The nozzle 249b and the buffer chamber 237 may be included in the O-containing gas supply system. The O-containing gas supply system may be referred to as an oxidizing agent supply system or an oxide gas supply system.

In the case of supplying the C-containing gas from the gas supply pipe 232e, a C-containing gas supply system is mainly configured by the gas supply pipe 232e, the MFC 241e, and the valve 243e. A downstream side of the connection part with the gas supply pipe 232e in the gas supply pipe 232b, the nozzle 249b and the buffer chamber 237 may be included in the C-containing gas supply system. In the case of supplying the hydrocarbon-based gas from the gas supply pipe 232e, the C-containing gas supply system may be referred to as a hydrocarbon-based gas supply system or a hydrocarbon supply system.

One or all of the gas supply systems of the B-containing gas supply system, the O-containing gas supply system, and the C-containing gas supply system may be referred to as a reaction gas supply system or a reactant supply system. In addition, the precursor gas supply system and the reaction gas supply system may be generally referred to as a film-forming gas supply system.

Furthermore, an inert gas supply system is mainly constituted by the gas supply pipes 232c and 232d, the MFCs 241c and 241d, and the valves 243c and 243d. The inert gas supply system may be referred to as a purge gas supply system, a dilution gas supply system, or a carrier gas supply system.

Figure 2:
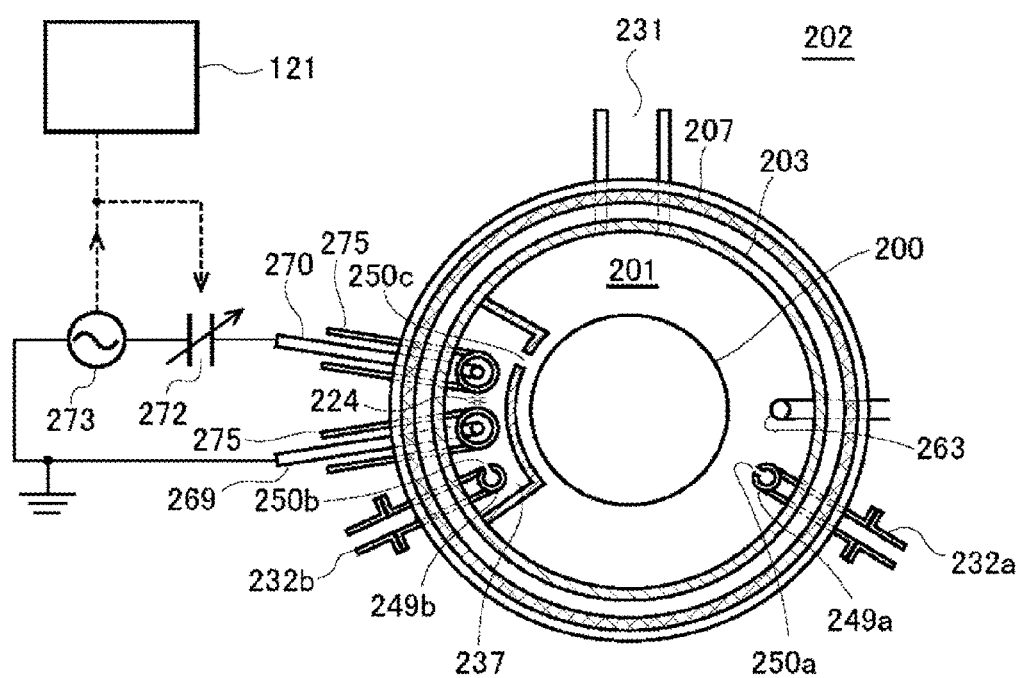
FIG. 2 is a schematic configuration diagram of a vertical type processing furnace of a substrate processing apparatus suitably used in one embodiment of the present disclosure, in which a portion of the processing furnace is shown in a cross sectional view taken along line A-A in FIG. 1.

As illustrated in FIG. 2, two rod-shaped electrodes 269 and 270 made of a conductive material and having an elongated structure are disposed within the buffer chamber 237 to extend along the stacking direction of the wafers 200 from the lower portion to the upper portion of the reaction tube 203. The respective rod-shaped electrodes 269 and 270 are installed in parallel to the nozzle 249d. Each of the rod-shaped electrodes 269 and 270 is covered with an electrode protection tube 275 for protection from the upper portion to the lower portion of the rod-shaped electrodes 269 and 270. One of the rod-shaped electrodes 269 and 270 is connected to a high-frequency power source 273 via a matcher 272 and the other is connected to ground which is a reference potential. By applying radio-frequency (RF) power from the high-frequency power source 273 between the rod-shaped electrodes 269 and 270 via the matcher 272, plasma is generated in a plasma generation region 224 between the rod-shaped electrodes 269 and 270. A plasma source as a plasma generator (plasma generation part) is mainly configured by the rod-shaped electrodes 269 and 270 and the electrode protection tubes 275. The matcher 272 and the high-frequency power source 273 may be included in the plasma source. The plasma source functions as an excitation part (activation mechanism) for plasma-exciting a gas, i.e., exciting (or activating) a gas in a plasma state, as will be described later.

The electrode protection tubes 275 have a structure allowing the respective rod-shaped electrodes 269 and 270 to be inserted into the buffer chamber 237 in a state in which the rod-shaped electrodes 269 and 270 are isolated from the internal atmosphere of the buffer chamber 237. When an internal O concentration within the electrode protection tubes 275 is substantially equal to an O concentration in the ambient air (atmosphere), the rod-shaped electrodes 269 and 270 respectively inserted into the electrode protection tubes 275 may be oxidized by heat generated from the heater 207. Thus, by filling the interior of the electrode protection tube 275 with an inert gas such as an $N_2$ gas or by purging the inside of the electrode protection tubes 275 with an inert gas such as an $N_2$ gas using an inert gas purge mechanism, it is possible to decrease the O concentration within the electrode protection tubes 275, thereby preventing the rod-shaped electrodes 269 and 270 from being oxidized.

The exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201, and an auto pressure controller (APC) valve 244 as a pressure regulator (pressure regulation part). The APC valve 244 is a valve configured to perform/stop vacuum exhaust of the interior of the process chamber 201 by opening and closing the APC valve 244 while operating the vacuum pump 246 and further to regulate the internal pressure of the process chamber 201 by adjusting the opening degree of the APC valve 244 based on the pressure information detected by the pressure sensor 245 while operating the vacuum pump 246. An exhaust system is mainly configured by the exhaust pipe 231, the APC valve 244 and the pressure sensor 245. The vacuum pump 246 may be included in the exhaust system.

A seal cap 219, which serves as a furnace opening lid configured to air-tightly seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. That is, the boat elevator 115 is configured as a transfer device (transfer mechanism) which transfers the boat 217, namely the wafers 200, into and out of the process chamber 201.

The boat 217 serving as a substrate support is configured to support a plurality of wafers 200, e.g., 25 to 200 wafers 200, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to this configuration. For example, instead of installing the heat insulating plates 218 below the boat 217, a heat insulating tube configured with a tubular member made of a heat resistant material such as quartz or SiC may be installed under the boat 217.

A temperature sensor 263 serving as a temperature detector is installed inside the reaction tube 203. Based on temperature information detected by the temperature sensor 263, an amount of electric power supplied to the heater 207 is adjusted such that the interior of the process chamber 201 has a desired temperature distribution. Similar to the nozzles 249a and 249b, the temperature sensor 263 is formed in an L shape. The temperature sensor 263 is installed along the inner wall of the reaction tube 203.

Figure 3:
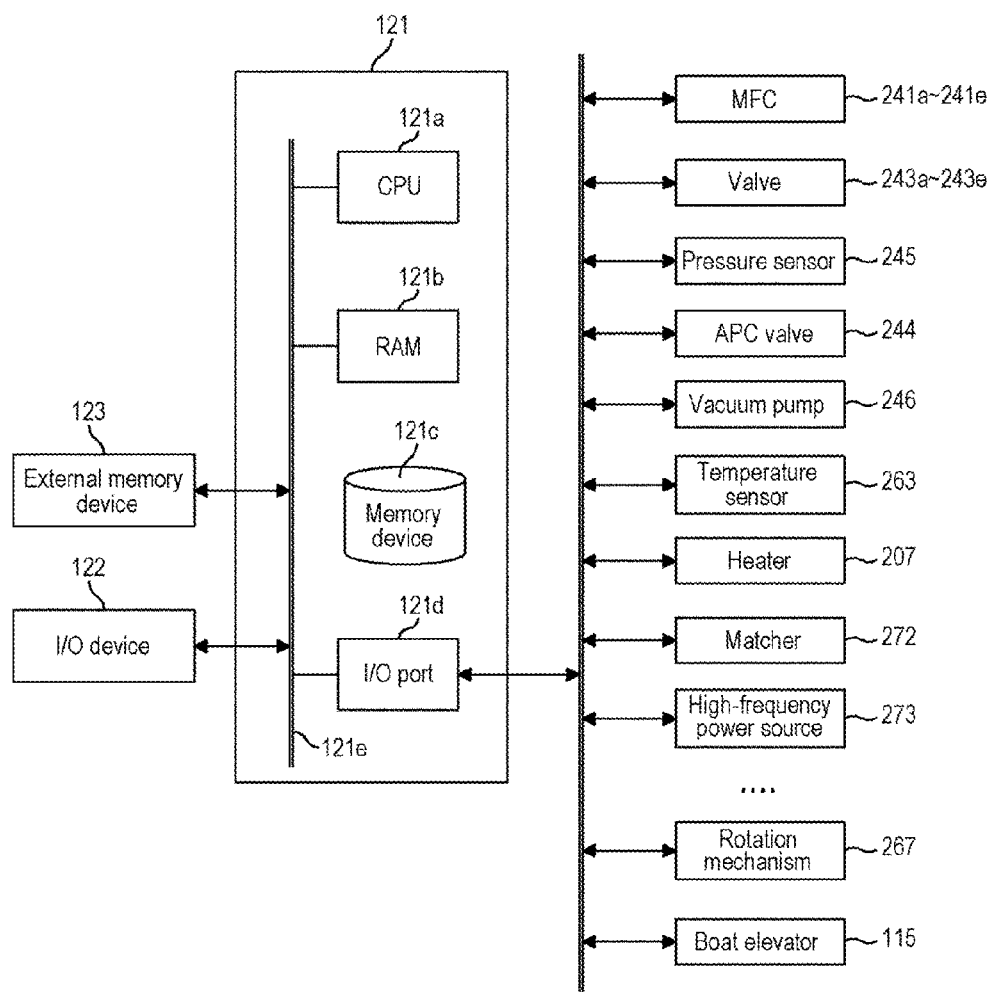
FIG. 3 is a schematic configuration diagram of a controller of a substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e.

An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described later, or the like is readably stored in the memory device 121c. The process recipe functions as a program for causing the controller 121 to execute each sequence in a substrate processing process to be described later, to obtain a predetermined result. Hereinafter, the process recipe and the control program will be generally and simply referred to as a "program".

When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the high-frequency power source 273, the matcher 272, the rotation mechanism 267, the boat elevator 115 and the like, as described above.

The CPU 121a is configured to read the control program from the memory device 121c and execute the same. The CPU 121a also reads the process recipe from the memory device 121c according to an input of an operation command from the input/output device 122. The CPU 121a is configured to control, according to the contents of the process recipe thus read, the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the driving and stopping of the vacuum pump 246, the temperature adjusting operation of the heater 207 based on the temperature sensor 263, the power supply by the high-frequency power source 273, the impedance adjustment operation using the matcher 272, the operation of rotating the boat 217 with the rotation mechanism 267 and adjusting the rotation speed of the boat 217, the operation of moving the boat 217 up and down with the boat elevator 115, and the like.

The controller 121 is not limited to being configured as a dedicated computer but may be configured as a general-purpose computer. For example, the controller 121 according to the present embodiment may be configured by installing, on the computer, the aforementioned program stored in an external memory device 123 (for example, a magnetic tape, a magnetic disc such as a flexible disk or a hard disk, an optical disc such as a CD or DVD, a magneto-optical disc such as an MO, a semiconductor memory such as a USB memory or a memory card). However, a means for supplying a program to the computer is not limited to the case of supplying the program through the external memory device 123. For example, the program may be supplied to the computer using a communication means such as the Internet or a dedicated line, instead of using the external memory device 123. The memory device 121c or the external memory device 123 is configured as a non-transitory computer-readable recording medium. Hereinafter, the memory device 121c and the external memory device 123 will be generally and simply referred to as a "recording medium."

When the term "recording medium" is used herein, it may indicate a case of including only the memory device 121c, a case of including only the external memory device 123, or a case of including both the memory device 121c and the external memory device 123.

(2) Substrate Processing Process

A sequence example of forming a film on a substrate using the aforementioned substrate processing apparatus, which is one of the processes for manufacturing a semiconductor device, will be described below with reference to FIG. 4A. In the following descriptions, the operations of the respective parts constituting the substrate processing apparatus are controlled by the controller 121.

In the film forming sequence of the present embodiment, a silicon boron oxynitride film (SiBON film) containing B, N, O and Si, or a silicon boric acid carbonitride film (SiBOCN film) containing B, N, O, C and Si is formed on the wafer 200 by performed a cycle n times (where n is an integer equal to or greater than 1), the cycle including alternately performing:

a step of performing a set m times (where m is an integer equal to or greater than 1), the set including step 1 of supplying an HCDS gas as a precursor to a wafer 200 as a substrate and step 2 of supplying a TMB gas as a borazine compound to the wafer 200; and step 3 of supplying an $O_2$ gas as an oxidizing agent to the wafer 200.

In the present disclosure, for the sake of convenience, the film forming sequence mentioned above may sometimes be denoted as follows. The same denotation will be used in the embodiment, the modifications and other embodiments to be described below.

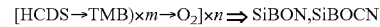

Figure 4A:
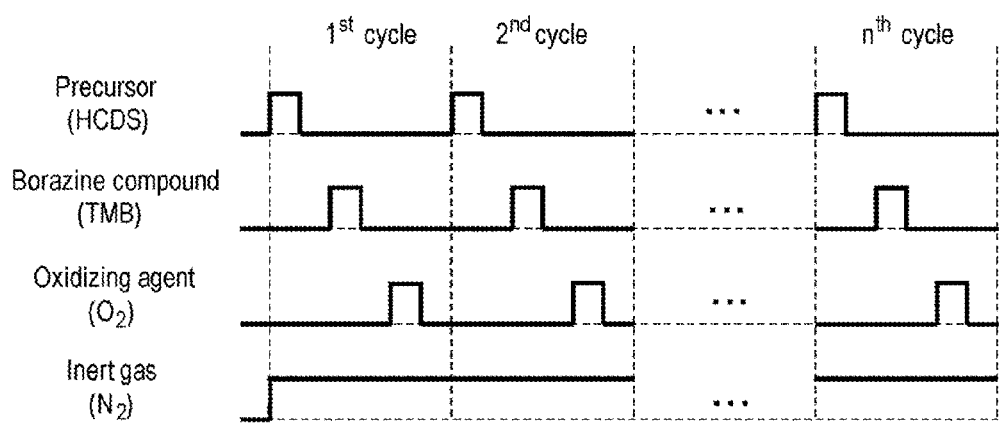
FIG. 4A is a diagram illustrating a gas supply timing in a film forming sequence according to one embodiment of the present disclosure.

FIG. 4A illustrates an example in which a cycle of alternately performing the step of performing a set including step 1 of supplying an HCDS gas and step 2 of supplying a TMB gas once, and step 3 of supplying an $O_2$ gas to the wafer 200 is implemented n times. That is, FIG. 4A illustrates an example in which a cycle of performing a set including step 1 and step 2 once (m=1), and then performing step 3 is implemented n times. In other words, FIG. 4A illustrates an example in which a cycle of non-simultaneously (non-synchronously) performing steps 1 to 3 is implemented n times. FIG. 4A may be said to be an example in which m is 1 and n is an integer equal to or greater than 2.

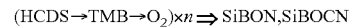

When the term "wafer" is used in the present disclosure, it may refer to "a wafer itself" or "a laminated body (aggregate) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, similar to the case of using the term "wafer", when the term "substrate" is used in the present disclosure, the term "substrate' may be synonymous with the term "wafer" in the foregoing descriptions.

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information (pressure regulation). The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. The heating of the interior of the process chamber 201 by the heater 207 may be continuously performed at least until the processing of the wafers 200 is completed. In addition, the rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film Forming Process)

Next, the following three steps, for example, steps 1 to 3, are sequentially performed.

[Step 1]

(HCDS Gas Supply)

At this step, an HCDS gas is supplied to the wafer 200 within the process chamber 201.

The valve 243a is opened to allow an HCDS gas to flow through the gas supply pipe 232a. The flow rate of the HCDS gas is adjusted by the MFC 241a. The HCDS gas is supplied into the process chamber 201 via the nozzle 249a and is exhausted from the exhaust pipe 231. At this time, the HCDS gas is supplied to the wafer 200. Simultaneously, the valve 243c is opened to allow an N₂ gas to flow through the gas supply pipe 232c. The flow rate of the N₂ gas is adjusted by the MFC 241c. The N₂ gas is supplied into the process chamber 201 together with the HCDS gas and is exhausted from the exhaust pipe 231.

Furthermore, in order to prevent the HCDS gas from entering the buffer chamber 237 or the nozzle 249b, the valve 243d is opened to allow the N₂ gas to flow through the gas supply pipe 232d. The N₂ gas is supplied into the process chamber 201 via the gas supply pipe 232b, the nozzle 249b and the buffer chamber 237 and is exhausted from the exhaust pipe 231.

The supply flow rate of the HCDS gas controlled by the MFC 241a may be set to fall within a range of, for example, 1 to 2,000 sccm, specifically 10 to 1,000 sccm. The supply flow rates of the N₂ gas controlled by the MFCs 241c and 242d may be respectively set to fall within a range of, for example, 100 to 10,000 sccm. The internal pressure of the process chamber 201 may be set to fall within a range of, for example, 1 to 2,666 Pa, specifically 67 to 1,333 Pa. The time period, during which the HCDS gas is supplied to the wafer 200, namely the gas supply time period (the irradiation time period), may be set to fall within a range of, for example, 1 to 120 seconds, specifically 1 to 60 seconds. The temperature of the heater 207 is set to fall within a range of, for example, 250 to 700 degrees C., specifically 300 to 650 degrees C., more specifically 350 to 600 degrees C.

When the temperature of the wafer 200 is lower than 250 degrees C., it is hard to chemisorb HCDS onto the wafer 200, so that a practical deposition rate may not be obtained. This may be solved by setting the temperature of the wafer 200 to become 250 degrees C. or higher. By setting the temperature of the wafer 200 to become 250 degrees C. or higher, or further 350 degrees C. or higher, it is possible to more sufficiently adsorb HCDS onto the wafer 200, so that a more sufficient deposition rate can be obtained.

When the temperature of the wafer 200 exceeds 700 degrees C., a chemical vapor deposition (CVD) reaction becomes too strong (an excessive gas phase reaction may occur). Thus, the film thickness uniformity is likely to deteriorate and the control of the film thickness uniformity becomes difficult. By setting the temperature of the wafer 200 at 700 degrees C. or lower, an appropriate gas phase reaction can occur to suppress the deterioration of the film thickness uniformity and to control the film thickness uniformity. In particular, by setting the temperature of the wafer 200 to 650 degrees C. or lower, or further 600 degrees C. or lower, the surface reaction becomes more dominant than the gas phase reaction. This makes it easy to secure the film thickness uniformity, so that control of the film thickness uniformity becomes easy.

Accordingly, it is desirable that the temperature of the wafer 200 be set to fall within a range of 250 to 700 degrees C., specifically 300 to 650 degrees C., more specifically 350 to 600 degrees C.

By supplying the HCDS gas to the wafer 200 under the aforementioned conditions, a Si-containing layer containing Cl and having a thickness of, e.g., less than one atomic layer to several atomic layers is formed on the uppermost surface of the wafer 200. The Si-containing layer containing Cl may include a Si layer containing Cl, an adsorption layer of HCDS, or both.

The Cl-containing Si layer generally refers to a continuous or discontinuous layer formed of Si and containing Cl, or a Si thin film containing Cl formed by laminating the continuous layer and the discontinuous layer. The continuous layer formed of Si and containing Cl may be a Si thin film containing Cl. Si constituting the Si layer containing Cl includes Si whose bonding to Cl is completely broken as well as Si whose bonding to Cl is not completely broken.

The adsorption layer of HCDS includes a continuous adsorption layer and a discontinuous adsorption layer constituted by HCDS molecules. That is, the adsorption layer of HCDS includes an adsorption layer having a thickness of one molecular layer or less constituted by HCDS molecules. The HCDS molecules constituting the adsorption layer of HCDS include molecules in which Si—Cl bonding is broken. That is, the adsorption layer of HCDS may include a physisorption layer of HCDS, a chemisorption layer of HCDS, or both.

Here, the layer having a thickness of less than one atomic layer means an atomic layer which is discontinuously formed, and the layer having a thickness equal to one atomic layer means an atomic layer which is continuously formed. The layer having a thickness of less than one molecular layer means a molecular layer which is discontinuously formed, and the layer having a thickness equal to one molecular layer means a molecule layer which is continuously formed. The Si-containing layer containing Cl may include both the Si layer containing Cl and the adsorption layer of HCDS. However, as described above, the Si-containing layer containing Cl will be represented by the expression of "one atomic layer," "several atomic layers" or the like.

Under a condition in which the HCDS gas is autolyzed (pyrolyzed), namely under a condition in which a pyrolysis reaction of the HCDS gas occurs, Si is deposited on the wafer 200 to form a Si layer containing Cl. Under a condition in which the HCDS gas is not autolyzed (not pyrolyzed), namely under a condition in which a pyrolysis reaction of the HCDS gas does not occur, HCDS is adsorbed onto the wafer 200 to form an adsorption layer of HCDS. Forming the Si layer containing Cl on the wafer 200 is desirable in view of providing a higher film formation rate than forming the adsorption layer of HCDS on the wafer 200. Hereinafter, the Si-containing layer containing Cl is also referred to simply as a Si-containing layer for convenience's sake.

When the thickness of the Si-containing layer exceeds several atomic layers, a modifying action at steps 2 and 3 described later does not reach the entire Si-containing layer. In addition, a minimum value of the thickness of the Si-containing layer is less than one atomic layer. Accordingly, it is desirable that the thickness of the Si-containing layer be from less than one atomic layer to several atomic layers. By setting the thickness of the Si-containing layer at one atomic layer or less, namely one atomic layer or less than one atomic layer, it is possible to relatively enhance the modifying reaction at steps 2 and 3, which will be described later, and to shorten the time required for the modifying reactions at steps 2 and 3. Furthermore, it is possible to shorten the time required in forming the Si-containing layer at step 1. As a result, it is possible to shorten the processing time per one cycle and to shorten the total processing time. That is, it is also possible to increase the film formation rate. Moreover, by setting the thickness of the Si-containing layer at one atomic layer or less, it is possible to enhance the controllability of the film thickness uniformity.

(Residual Gas Removal)

After the Si-containing layer is formed, the valve 243a is closed to stop the supply of the HCDS gas. At this time, the interior of the process chamber 201 is vacuum-exhausted by the vacuum pump 246 while opening the APC valve 244. Thus, the unreacted HCDS gas or the HCDS gas contributed to the formation of the Si-containing layer, which remains within the process chamber 201, is removed from the interior of the process chamber 201. At this time, the supply of the $N_2$ gas into the process chamber 201 is maintained while opening the valves 243c and 243d. The $N_2$ gas acts as a purge gas. This makes it possible to enhance the effect of removing the gas remaining within the process chamber 201 from the interior of the process chamber 201.

At this time, the gas remaining within the process chamber 201 may not be completely removed and the interior of the process chamber 201 may not be completely purged. If the amount of the gas remaining within the process chamber 201 is small, there is no possibility that an adverse effect is generated at step 2 which will be performed later. In this case, it is not necessary to make the flow rate of the $N_2$ gas supplied into the process chamber 201 large. For example, by supplying the $N_2$ gas substantially in the same amount as the volume of the reaction tube 203 (the process chamber 201), it is possible to perform a purge operation such that an adverse effect is not generated at step 2. By not completely purging the interior of the process chamber 201 in this way, it is possible to shorten the purge time and to improve the throughput. It is possible to suppress the consumption of the $N_2$ gas to a necessary minimum level.

As the precursor, it may be possible to use, other than the HCDS gas, for example, an inorganic halosilane precursor gas such as an OCTS gas, a dichlorosilane ($SiH_2Cl_2$, abbreviation: DCS) gas, a monochlorosilane ($SiH_3Cl$, abbreviation: MCS) gas, a tetrachlorosilane, i.e., silicon tetrachloride ($SiC_4$, abbreviation: STC) gas, a trichlorosilane ($SiHCl_3$, abbreviation: TCS) gas or the like. Furthermore, as the precursor, it may be possible to use, for example, an organic halosilane precursor gas such as a BTCSE gas, a BTCSM gas, a TCDMDS gas, a DCTMDS gas, an MCPMDS gas or the like. Furthermore, as the precursor, it may be possible to use, for example, an inorganic silane precursor gas not containing a halogen group, such as a monosilane ($SiH_4$, abbreviation: MS) gas, a disilane ($Si_2H_6$, abbreviation: DS) gas, a trisilane ($Si_3H_8$, abbreviation: TS) gas or the like. Moreover, as the precursor, it may be possible to use, for example, an organic silane precursor gas not containing a halogen group, such as a dimethylsilane ($SiC_2H_8$, abbreviation: DMS) gas, a trimethylsilane ($SiC_3H_{10}$, abbreviation: TMS) gas, a diethylsilane ($SiC_4H_{12}$, abbreviation: DES) gas, a 1,4-disilabutane ($Si_2C_2H_{10}$, abbreviation: DSB) gas or the like. In addition, as the precursor, it may be possible to use, for example, an amino-based (amine-based) silane precursor gas not containing a halogen group, such as a tris-dimethylaminosilane ($Si[N(CH_3)_2]_3H$, abbreviation: 3DMAS) gas, a tetrakis-dimethylaminosilane ($Si[N(CH_3)_2]_4$, abbreviation: 4DMAS) gas, a bis-diethylaminosilane ($Si[N(C_2H_5)_2]_2H_2$, abbreviation: BDEAS) gas, a bis-tertiary-butylaminosilane ($SiH_2[NH(C_4H_9)]_2$, abbreviation: BTBAS) gas or the like.

Furthermore, in the case of using the organic halosilane precursor gas or the organic silane precursor gas, which also acts as a C source as the precursor, C may be contained in the Si-containing layer. As a result, it is possible to increase a C concentration in a film formed on the wafer 200, compared with the case of using the inorganic halosilane precursor gas or the inorganic silane precursor gas as the precursor. Furthermore, in the case of using the amino-based silane source gas, which also acts as a C source and an N source as the precursor, C and N may be respectively contained in the Si-containing layer. As a result, it is possible to increase a C concentration and an N concentration in a film formed on the wafer 200, compared with the case of using the inorganic silane precursor gas as the precursor.

As the inert gas, it may be possible to use, other than the $N_2$ gas, a rare gas such as an Ar gas, a He gas, a Ne gas, a Xe gas or the like.

[Step 2]

(TMB Gas Supply)

After step 1 is completed, a TMB gas activated by heat is supplied to the wafer 200 within the process chamber 201, namely to the Si-containing layer containing Cl formed on the wafer 200.

At this step, the opening/closing control of the valves 243b to 243d is performed in the same procedure as the opening/closing control of the valves 243a, 243c, and 243d at step 1. The flow rate of the TMB gas is regulated by the MFC 241b. The TMB gas is supplied into the process chamber 201 via the nozzle 249b and the buffer chamber 237 and is exhausted from the exhaust pipe 231. At this time, the TMB gas is supplied to the wafer 200.

The supply flow rate of the TMB gas controlled by the MFC 241b may be set to fall within a range of, for example, 1 to 1,000 sccm. The internal pressure of the process chamber 201 may be set to fall within a range of, for example, 1 to 2,666 Pa, specifically 67 to 1,333 Pa. The partial pressure of the TMB gas within the process chamber 201 may be set to fall within a range of, for example, 0.0001 to 2,424 Pa. The time period, during which the TMB gas is supplied to the wafer 200, namely the gas supply time period (irradiation time period), may be set to fall within a range of, for example, 1 to 120 seconds, specifically 1 to 60 seconds. Other processing procedures and processing conditions may be similar to, for example, those of step 1.

By supplying the TMB gas to the wafer 200 under the aforementioned conditions, the Si-containing layer formed at step 1 and the TMB gas react with each other. That is, Cl (chloro group) contained in the Si-containing layer and a ligand (methyl group, hereinafter, referred to as an "organic ligand" or a "methyl ligand") contained in TMB react with each other. This makes it possible to separate (extract) Cl of the Si-containing layer reacting with the methyl ligand of TMB from the Si-containing layer and also to separate the methyl ligand of TMB reacting with Cl of the Si-containing layer from TMB. Furthermore, N constituting the borazine ring of TMB from which the methyl ligand is separated and Si of the Si-containing layer can be bonded. That is, N having a dangling bond from which the methyl ligand is separated, among B and N constituting the borazine ring of TMB, and Si having a dangling bond contained in the Si-containing layer or Si which has a dangling bond are bonded to form an Si—N bond. At this time, the borazine ring skeleton constituting the borazine ring of TMB is maintained without being damaged. Furthermore, the bond of the borazine ring and the methyl ligand, namely the N—C bond of TMB, is also partially maintained without being broken. In addition, the methyl group is one of alkyl groups and the methyl ligand may be referred to as an alkyl ligand.

By supplying the TMB gas under the aforementioned conditions, the Si-containing layer and TMB can appropriately react, while maintaining the borazine ring skeleton or the partial N—C bond of TMB without being damaged, to cause the series of reactions described above. It is considered that the most important factors (conditions) causing the series of reactions with the borazine ring skeleton in TMB maintained are the temperature of the wafer 200 and the internal pressure of the process chamber 201, in particular, the temperature of the wafer 200. It is possible to cause an appropriate reaction by appropriately controlling them.

By the series of reactions, a borazine ring is newly introduced into the Si-containing layer. Furthermore, the partial methyl ligand of TMB, namely the partial N—C bond of TMB, may also be newly introduced into the Si-containing layer. Thus, the Si-containing layer is modified to a first layer having the borazine ring skeleton and containing B, N, C, and Si, namely a silicon boron carbonitride layer (SiBCN layer) containing a borazine ring skeleton. The first layer becomes a layer having a thickness of less than 1 atomic layer to about several atomic layers. The SiBCN layer containing the borazine ring skeleton may be a layer containing Si, C, and a borazine ring skeleton.

As the borazine ring is newly introduced into the Si-containing layer, the B component and the N component constituting the borazine ring are newly introduced into the Si-containing layer. Furthermore, at this time, the C component contained in the ligand of TMB is also introduced into the Si-containing layer. In this way, as the Si-containing layer and TMB react with each other and the C component contained in the borazine ring or the methyl ligand is introduced into the Si-containing layer, the B component, the C component, and the N component can be newly added to the Si-containing layer.

When the first layer is formed, Cl contained in the Si-containing layer constitutes a gas phase material containing at least Cl in the course of the modifying reaction of the Si-containing layer by the TMB gas and is discharged from the interior of the process chamber 201. That is, an impurity such as Cl of the Si-containing layer is pulled out or desorbed from the Si-containing layer to be separated from the Si-containing layer. Thus, the first layer becomes a layer having less impurity such as Cl than the Si-containing layer.

When the first layer is formed, by maintaining (retaining) the borazine ring skeleton constituting the borazine ring contained in TMB, without being damaged, it is possible to maintain (retain) the central space of the borazine ring and to form a porous SiBCN layer.

Preferably, the TMB gas can be thermally activated and supplied in a non-plasma state to allow the aforementioned reaction to softly proceed and to facilitate formation of the first layer. That is, preferably, when the TMB gas is thermally activated and supplied in a non-plasma state, the introduction into the first layer can be facilitated while maintaining the borazine ring skeleton or the partial N—C bond of TMB without destruction, compared with a case where the TMB gas is plasma-excited and supplied.

(Residual Gas Removal)

After the first layer is formed, the valve 243b is closed to stop the supply of the TMB gas. Furthermore, the unreacted TMB gas or the TMB gas contributed to the formation of the first layer, which remains within the process chamber 201, is removed from the interior of the process chamber 201 under the same processing procedures as those of step 1. At this time, similar to step 1, it is not necessary to completely remove the gas or the like remaining within the process chamber 201.

As the borazine compound, it may be possible to use, other than to the TMB gas, for example, a TEB gas, a TPB gas, a TIPB gas, a TBB gas, a TIBB gas or the like. As the inert gas, it may be possible to use, other than to the $N_2$ gas, for example, a rare gas such as an Ar gas, a He gas, an Ne gas, a Xe gas or the like.

[Step 3]

($O_2$ Gas Supply)

After step 2 is completed, an $O_2$ gas activated by heat is supplied to the wafer 200, i.e., the first layer formed on the wafer 200, in the process chamber 201.

At this step, the opening/closing control of the valves 243b to 243d is performed in the same procedure as that of the valves 243a, 243c and 243d. The flow rate of the $O_2$ gas is regulated by the MFC 241b. The $O_2$ gas is supplied into the process chamber 201 via the nozzle 249b and the buffer chamber 237, and is exhausted from the exhaust pipe 231. At this time, the $O_2$ gas is supplied to the wafer 200.

The supply flow rate of the $O_2$ controlled by the MFC 241b may be set to fall within a range of, for example, 100 to 10,000 sccm. The internal pressure of the process chamber 201 may be set to fall within a range of, for example, 1 to 4,000 Pa, specifically, 1 to 3,000 Pa. The partial pressure of the $O_2$ gas within the process chamber 201 may be set to fall within a range of, for example, 0.01 to 3,960 Pa. By setting the internal pressure of the process chamber 201 to such a relatively high pressure, it is possible to thermally activate the $O_2$ gas in a non-plasma state. The supply of the $O_2$ gas thermally activated can cause a relatively soft reaction and oxidation described later can be performed softly. The time period, during which the $O_2$ gas is supplied to the wafer 200, namely the gas supply time period (irradiation time period), may be set to fall within a range of, for example, 1 to 120 seconds, specifically, 1 to 60 seconds. Other processing conditions may be similar to, for example, those of step 1.

At this time, the gas flowing into the process chamber 201 is the thermally activated $O_2$ gas, and neither the HCDS gas nor the TMB gas flows into the process chamber 201. Thus, the activated $O_2$ gas does not cause a gas phase reaction and is supplied to the first layer formed on the wafer 200 at step 2, namely to the SiBCN layer containing the borazine ring skeleton, and reacts with at least a portion of the first layer.

At this time, the O component contained in the $O_2$ gas is added to the first layer, so that an Si—O bond is formed in the first layer. At this time, at least a portion of the borazine ring skeleton in the first layer is maintained, without being damaged. In addition, at this time, at least a portion of the C component contained in the first layer is desorbed from the first layer. As these reactions proceed, the first layer is modified to a second layer, namely a layer containing the borazine ring skeleton and containing B, O, C, N, and Si (SiBOCN layer or a layer (SiBON layer) containing the borazine ring skeleton and containing B, O, N, and Si).

When the second layer is formed, an impurity such as Cl contained in the first layer constitutes a gas phase material containing at least Cl in the course of the modifying reaction by the $O_2$ gas and is discharged from the interior of the process chamber 201. That is, an impurity such as Cl of the first layer may be pulled out or desorbed from the first layer to be separated from the first layer. Thus, the second layer becomes a layer having less impurity such as Cl than the first layer.

By thermally activating the $O_2$ gas under a non-plasma atmosphere and allowing it to flow into the process chamber 201, it is possible to softly progress the aforementioned reaction. This makes it easier to maintain the borazine ring skeleton in the first layer. It is also easy to suppress desorption of C from the first layer. It is considered that the most important factors (conditions) for causing this reaction with the borazine ring skeleton maintained in the first layer are the temperature of the wafer 200 and the internal pressure of the process chamber 201, in particular, the temperature of the wafer 200. It is possible to cause an appropriate reaction by appropriately controlling them.

At step 3, it is desirable not to saturate the modifying reaction of the first layer. For example, when the first layer having a thickness of from less than one atomic layer to several atomic layers is formed at steps 1 and 2, it is desirable to oxidize at least a portion of the surface layer (one atomic layer of the surface). In this case, oxidation is performed under conditions in which the oxidation reaction of the first layer is unsaturated so as not to oxidize the entire first layer. Although some layers under the surface layer of the first layer may be oxidized according to conditions, it is desirable to oxidize only the surface layer to enhance controllability of a composition ratio of a film formed on the wafer 200. By lowering an oxidizing power at step 3, it is possible to suppress desorption of C from the first layer in the course of oxidation reaction. Since the Si—O bond has a stronger bond energy than the Si—C bond, when the Si—O bond is formed, the Si—C bond tends to be broken. Thus, by appropriately lowering the oxidizing power at step 3, it is possible to suppress the Si—C bond from being broken when the Si—O bond is formed in the first layer and to suppress C whose bond with Si is broken from being desorbed from the first layer. By setting the processing conditions at step 3 to conditions within the aforementioned processing condition range, it is possible to make the oxidation reaction of the first layer unsaturated.

At step 3, the processing conditions may be appropriately selected to lower the dilution ratio of the $O_2$ gas (increase the concentration), lengthen the supply time of the $O_2$ gas, or increase the partial pressure of the $O_2$ gas within the aforementioned processing condition range. Furthermore, the processing conditions may be appropriately selected to increase the dilution ratio of the $O_2$ gas (decrease the concentration), shorten the supply time of the $O_2$ gas, or decrease the partial pressure of the $O_2$ gas within the aforementioned processing condition range. By appropriately controlling the processing conditions of the oxidation reaction at step 3, it is possible to precisely control a composition of a film formed on the wafer 200, as described later.

(Residual Gas Removal)

After the second layer is formed, the valve 243b is closed to stop the supply of the 02 gas. Furthermore, the unreacted $O_2$ gas, the $O_2$ gas contributed to the formation of the second layer, or the reaction byproduct, which remains within the process chamber 201, is removed from the interior of the process chamber 201 under the same processing procedures as those of step 1. At this time, the concept that it is not necessary to completely remove the gas or the like remaining within the process chamber 201 is the same as those in step 1.

As the oxidizing agent, it may be possible to use, other than the $O_2$ gas, an O-containing gas such as water vapor ($H_2O$ gas), a nitrogen monoxide (NO) gas, a nitrous oxide ($N_2O$) gas, a nitrogen dioxide ($NO_2$) gas, a carbon monoxide (CO) gas, a carbon dioxide ($CO_2$) gas, an ozone (O) gas, a hydrogen ($H_2$) gas+$O_2$ gas, or an $H_2$ gas+$O_3$ gas or the like. As the inert gas, it may be possible use, other than the $N_2$ gas, for example, various kinds of rare gases exemplified at step 1.

(Performing a Predetermined Number of Times)

A cycle which non-simultaneously, i.e., non-synchronously, performs steps 1 to 3 described above is implemented a predetermined number of times (n times), namely once or more. Thus, an SiBOCN film or an SiBON film having a predetermined composition and a predetermined film thickness can be formed on the wafer 200. This film becomes a film containing a borazine ring skeleton. It is desirable that the aforementioned cycle be repeated multiple times. That is, it is desirable that the thickness of the second layer formed per one cycle be set smaller than a desired thickness and the aforementioned cycle be repeated multiple times until the thickness of the second layer becomes equal to the desired thickness.

(Purging and Atmospheric Pressure Restoration)

After the film forming process is completed, the valves 243c and 243d are opened and the $N_2$ gas is supplied from each of the gas supply pipes 232c and 232d into the process chamber 201 and is exhausted from the exhaust pipe 231. The $N_2$ gas acts as a purge gas. Thus, the interior of the process chamber 201 is purged and the gas or the reaction byproduct, which remains within the process chamber 201, is removed from the interior of the process chamber 201 (purging). Thereafter, the internal atmosphere of the process chamber 201 is substituted by an inert gas (inert gas substitution). The internal pressure of the process chamber 201 is restored to atmospheric pressure (atmospheric pressure restoration).

(Boat Unloading and Wafer Discharging)

The seal cap 219 is moved down by the boat elevator 115 to open the lower end of the reaction tube 203. The processed wafers 200 supported on the boat 217 are unloaded from the lower end of the reaction tube 203 to the outside of the reaction tube 203 (boat unloading). The processed wafers 200 are discharged from the boat 217 (wafer discharging).

(3) Effects According to the Present Embodiment

According to the present embodiment, one or more effects as set forth below may be achieved.

(a) By supplying the borazine compound such as the TMB gas at step 2, the borazine ring skeleton can be contained in the film formed on the wafer 200.

Therefore, it is possible to form a film with low dielectric constant on the wafer 200. This is because the film containing the borazine ring skeleton (porous film) has lower atomic density in the film and lower dielectric constant than a film which does not contain the borazine ring skeleton (non-porous film). Thus, as the film forming process using the TMB gas containing the borazine ring skeleton is performed to contain the borazinecyclic skeleton in the film formed on the wafer 200, it is possible to appropriately lower the density of the film to thereby increase the dielectric constant.

Furthermore, this film can become a film having high oxidation resistance. This is because the B—N bond constituting the borazine ring skeleton has a less bias of shared electrons (small polarity) and is strong. Thus, as the film forming process using the TMB gas containing the borazine ring skeleton is performed to contain the borazine ring skeleton in the film formed on the wafer 200, it is possible to provide a film having a smaller probability of desorption of B from the film by oxidation, oxidation resistance, for example, high resistance to oxygen plasma or the like, namely high ashing resistance, than that of a film which does not contain the borazine ring skeleton. In addition, the present inventors confirmed that, when oxygen plasma or the like is supplied to the SiBCN film which does not contain the borazine ring skeleton, B, C, and N are easily desorbed sequentially from the film (i.e., B is most easily desorbed among B, C and N, and then C is the next easily desorbed).

Furthermore, by performing the film forming process using the TMB gas containing the borazine ring skeleton at step 2, it is also possible to increase not only the oxidation resistance of the film after the film formation but also the oxidation resistance of the film during the film formation. This is because, by containing the borazine ring skeleton in the first layer formed at step 2, it is possible to suppress desorption of B or N from the layer at step 3 which will be subsequently performed. By suppressing desorption of B or N from the first layer, it is possible to make a film on the wafer 200 having a high B concentration and N concentration.

(b) By supplying the $O_2$ gas as the oxidizing agent to oxidize the first layer containing the borazine ring skeleton at step 3, O can be contained in the film formed on the wafer 200.

Thus, it is possible to form a film on the wafer 200 having high insulating properties, i.e., a film with high leak resistance, compared with the film containing the borazine ring skeleton formed by alternately performing steps 1 and 2.

In addition, it is possible to form a film on the wafer 200 having high oxidation resistance, compared with a film containing the borazine ring skeleton formed by alternately performing steps 1 and 2. This is possible because the film formed on the wafer 200 by performing step 3 contains a strong Si—O bond in the film. By containing the Si—O bond in the film containing the borazine ring skeleton, it is possible to form a film having high oxidation resistance, compared with a film which contains the borazine ring skeleton and does not contain O.

Furthermore, by performing step 3, it is possible to enhance the surface roughness of the film formed on the wafer 200, compared with the film containing the borazine ring skeleton formed by alternately performing steps 1 and 2. The term "surface roughness" refers to a difference in height within a wafer surface or an arbitrary target surface, and has the same meaning as the surface coarseness. Enhancement of surface roughness means that the height difference becomes smaller, i.e., the surface become smooth. A deterioration of surface roughness means that the height difference becomes larger, i.e., the surface become rough.

A film with a high content of borazine ring skeletons tends to have lower surface roughness than that of a film with a low content of the borazine ring skeletons. As in the present embodiment, by performing step 3 in addition to steps 1 and 2, it is possible to break a portion of the borazine ring skeleton contained in the first layer and to desorb the borazine ring skeleton from the first layer. That is, it is possible to appropriately adjust an amount of the borazine ring skeleton contained in the film formed on the wafer 200. As a result, it is possible to enhance the surface roughness of the film, compared with the film containing the borazine ring skeleton formed by alternately performing steps 1 and 2.

(c) By appropriately controlling the processing conditions of oxidation reaction at step 3 within a range where the oxidation reaction of the first layer is not saturated at step 3, it is possible to precisely control the composition of the film formed on the wafer 200.

For example, by strengthening the oxidizing power of the $O_2$ gas supplied at step 3 or lengthening the supply time of the $O_2$ gas, it is possible to increase an amount of O added to the first layer or an amount of C desorbed from the first layer. Thus, it is possible to increase an O concentration or decrease a C concentration in the film formed on the wafer 200. Furthermore, by strengthening the oxidizing power of the $O_2$ gas supplied at step 3 or lengthening the supply time of the Oz gas, it is easy to break a portion of the borazine ring skeleton contained in the first layer to thereby desorb the borazine ring skeleton itself from the first layer. Thus, it is possible to promote desorption of B and N from the first layer and to appropriately lower a B concentration or an N concentration in the film formed on the wafer 200.

In addition, for example, by wakening the oxidizing power of the $O_2$ gas supplied at step 3 or shortening the supply time of the $O_2$ gas, it is possible to reduce an amount of O added to the first layer or an amount of C desorbed from the first layer. Thus, it is possible to suppress an increase in the O concentration or a decrease in the C concentration in the film formed on the wafer 200. Furthermore, by weakening the oxidizing power of the $O_2$ gas supplied at step 3 or shortening the supply time of the $O_2$ gas, it is possible to easily maintain the borazine ring skeleton contained in the first layer without being broken to thereby suppress desorption of the borazine ring skeleton from the first layer. That is, since the desorption of B or N from the first layer can be suppressed, the amount of B or N contained in the film formed on the wafer 200 can be easily maintained, without being reduced.

(d) By using the TMB gas obtained by vaporizing the organic borazine compound at step 2, it is possible to contain an appropriate amount of C in the finally formed film. That is, by using the B-containing gas acting as the C source containing the organic ligand such as the TMB gas at step 2, it is possible to form the SiBON film containing C, i.e., the SiBOCN film, on the wafer 200, without newly adding a step of supplying a C-containing gas such as a $C_3H_6$ gas or the like. In this manner, by containing an appropriate amount of C in the film, it is possible to enhance the resistance to hydrogen fluoride (HF) of the film, i.e., etching resistance.

(e) By using the halosilane precursor gas such as the HCDS gas at step 1 and the organic borazine-based gas such as the TMB gas at step 2, it is possible to effectively perform the formation process of the first layer.

This is because, by supplying the HCDS gas containing Cl, i.e., the halosilane precursor gas with high adsorbability to an underlying layer, to the wafer 200 at step 1, the first layer can be effectively formed on the wafer 200. Furthermore, after the formation of the Si-containing layer containing Cl as the first layer at step 1, by supplying the TMB gas containing an organic ligand to the first layer at step 2, it is possible to effectively form the second layer. That is, by using the reaction between Cl contained in the first layer and the organic ligand contained in the TMB gas at step 2, it is possible to enhance the reaction efficiency between the first layer and the TMB gas. As a result, a process of forming the second layer can effectively proceed.

In this manner, by supplying the gas containing the organic ligand after the supply of the gas containing a halogen element in performing the film forming process, the layer formed on the wafer 200 and the gas supplied to the layer can effectively react with each other. As a result, it is possible to increase the formation rate of the first layer and to enhance the deposition rate of the film formed on the wafer 200. In addition, it is possible to reduce the amount of the gases (the HCDS gas and the TMB gas) which do not contribute to the film forming process and are discharged from the interior of the process chamber 201, and also to reduce the film formation cost.

(f) By non-simultaneously performing steps 1 to 3, namely by non-simultaneously supplying the HCDS gas, the TMB gas, and the $O_2$ gas without synchronization, it is possible to appropriately contribute these gases to a reaction under a condition in which a gas phase reaction or a surface reaction appropriately occurs. As a result, it is possible to enhance the step coverage and the film thickness controllability of the film formed on the wafer 200. In addition, it is possible to avoid an excessive gas phase reaction within the process chamber 201 and also to suppress the generation of particles.

(g) The effects mentioned above can be similarly achieved in the case where a gas other than the HCDS gas is used as the precursor, or in the case where a gas other than the TMB gas is used as the borazine compound, or in the case where a gas other than the $O_2$ gas is used as the oxidizing agent.

(4) Modifications

The film forming sequence of the present embodiment is not limited to the one illustrated in FIG. 4 and may be modified as in the modifications to be described below.

Modification 1

Figure 4B:
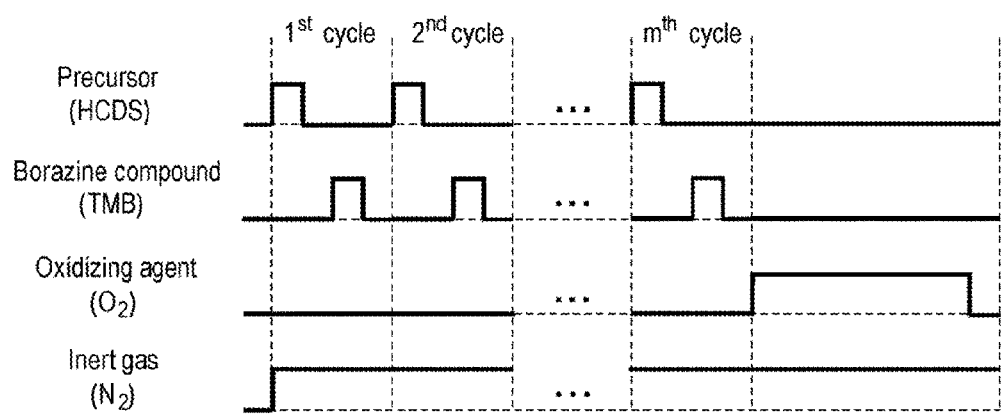
FIG. 4B is a diagram illustrating a gas supply timing of modification 1 of the film forming sequence according to one embodiment of the present disclosure.

As in the film forming sequence illustrated in FIG. 4B or shown below, a cycle of performing step 3 after performing a set of performing steps 1 and 2 a plurality of times (m times) may be implemented once (n=1). This modification is an example in which m is an integer equal to or greater than 2 and n is 1. Even in this modification, the same effects as those of the film forming sequence of FIG. 4A may be achieved.

(HCDS→TMB)×m→$O_2$ ⇒ SiBOCN,SiBON

Modification 2

As in the film forming sequence illustrated in FIG. 4C or shown below, a cycle of performing step 3 after performing a set of performing steps 1 and 2 a plurality of times (m times) may be implemented a plurality of times (n times). This modification is an example in which m is an integer equal to or greater than 2 and n is an integer equal to or greater than 2. FIG. 4C illustrates an example in which a cycle of performing step 3 after performing a set of performing steps 1 and 2 two times is repeated n times. Even in this modification, the same effects as those of the film forming sequence of FIG. 4A may be achieved.

[(HCDS→TMB)×m→$O_2$]×n ⇒ SiBOCN, SiBON

Modification 3

As in the film forming sequence shown below, the $O_2$ gas activated with plasma may be supplied, instead of supplying the $O_2$ gas activated by heat, at step 3. That is, the oxidation reaction of the first layer may be performed not under a non-plasma atmosphere but by using plasma. In this case, most of C contained in the first layer can be desorbed from the first layer, and an SiBON layer not containing C is formed as the second layer. That is, an SiBON film containing a borazine ring skeleton is formed on the wafer 200. Even in this modification, the same effects as those of the film forming sequence of FIG. 4A may be achieved.

[(HCDS→TMB)×m→$O_2$ plasma]×n ⇒ SiBON

When the $O_2$ gas activated by plasma is supplied at step 3, the supply flow rate of the $O_2$ gas controlled by the MFC 241b may be set to fall within a range of, for example, 100 to 10,000 sccm. The high-frequency power applied between the rod-shaped electrodes 269 and 270 may be set to fall within a range of, for example, 50 to 1,000 W. The internal pressure of the process chamber 201 may be set to fall within a range of, for example, 1 to 100 Pa. The partial pressure of the $O_2$ gas within the process chamber 201 may be set to fall within a range of, for example, 0.01 to 100 Pa. The time period, during which the active species obtained by plasma-exciting the $O_2$ gas are supplied to the wafer 200, namely the gas supply time period (irradiation time period), may be set to fall within a range of, for example, 1 to 12 seconds, specifically 1 to 60 seconds. Other processing conditions may be similar to those of step 3 described above.

Modification 4

As in the film forming sequence shown below, an $O_3$ gas having higher oxidizing power than that of the $O_2$ gas may be used as the oxidizing agent at step 3. In this case, most of C contained in the first layer can be desorbed from the first layer, and an SiBON layer not containing C is formed in the second layer. That is, an SiBON film containing a borazine ring skeleton is formed on the wafer 200. Even in this modification, the same effects as those of the film forming sequence of FIG. 4A may be achieved.

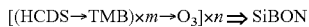
[(HCDS→TMB)×m→O₃]×n ⇒ SiBON

Modification 5

As in the film forming sequence shown below, oxidation species not containing water ($H_2O$) such as atomic oxygen (O) as an oxidizing agent, the atomic oxygen being generated through the reaction between an $O_2$ gas and an $H_2$ gas at a pressure of less than atmospheric pressure (under the depressurization), may be used at step 3. In this case, most of C contained in the first layer can be desorbed from the first layer, and an SiBON layer not containing C is formed as the second layer. That is, an SiBON film containing a borazine ring skeleton is formed on the wafer 200. Even in this modification, the same effects as those of the film forming sequence of FIG. 4A may be achieved.

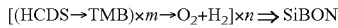
[(HCDS→TMB)×m→O₂+H₂]×n ⇒ SiBON

When the $O_2$ gas and the $H_2$ gas are supplied at step 3, it is desirable that the supply of the $H_2$ gas be performed from, for example, the gas supply pipe 232a, so that the $O_2$ gas and the $H_2$ gas are first mixed (post-mixed) in the process chamber 201. The supply flow rate of the $O_2$ gas controlled by the MFC 241b and the supply flow rate of the $H_2$ gas controlled by the MFC 241a may be respectively set to fall within a range of, for example, 100 to 10,000 sccm. The internal pressure of the process chamber 201 may be set to be lower than atmospheric pressure, for example, to fall within a range of 1 to 1,000 Pa. The time period, during which the $O_2$ gas and the $H_2$ gas are supplied to the wafer 200, namely the gas supply time period (irradiation time period), may be set to fall within a range of, for example, 1 to 120 seconds, specifically 1 to 60 seconds. Other processing conditions may be similar to those of step 3 of the film forming sequence of FIG. 4A.

Modification 6

The film forming sequence illustrated in FIG. 4A or each of the modifications described above may further include a step of supplying a C-containing gas such as a $C_3H_6$ gas or the like to the wafer 200. The step of supplying the $C_3H_6$ gas may be performed non-simultaneously with a step of supplying a precursor such as an HCDS gas, a step of supplying a borazine compound such as a TMB gas, and a step of supplying an oxidizing agent such as an $O_2$ gas, or may be performed simultaneously with at least one of these steps. For example, the step of supplying the $C_3H_6$ gas may be performed simultaneously with the step of supplying the TMB gas.

Even in this modification, the same effects as those of the film forming sequence of FIG. 4A or each of the modifications described above may be achieved. Furthermore, according to this modification, the C component contained in the $C_3H_6$ gas can be added to the film formed on the wafer 200 to increase the C concentration in the film. However, preferably, when the $C_3H_6$ gas is not supplied simultaneously with the HCDS gas but supplied simultaneously with the TMB gas, it is possible to avoid an excessive gas phase reaction in the process chamber 201 and to suppress the generation of particles in the process chamber 201.

When the $C_3H_6$ gas is supplied to the wafer 200, the supply flow rate of the $C_3H_6$ gas controlled by the MFC 241e may be set to fall within a range of, for example, 100 to 10,000 sccm. The internal pressure of the process chamber 201 may be set to fall within a range of 1 to 5,000 Pa, specifically 1 to 4,000 Pa. The partial pressure of the $C_3H_6$ gas within the process chamber 201 may be set to fall within a range of, for example, 0.01 to 4,950 Pa. The time period, during which the $C_3H_6$ gas is supplied to the wafer 200, namely the gas supply time period (irradiation time period), may be set to fall within a range of, for example, 1 to 200 seconds, specifically 1 to 120 seconds, more specifically 1 to 60 seconds. Other processing conditions may be similar to those of step 2 of the film forming sequence of FIG. 4A. As the C-containing gas, it may be possible to use, other than the $C_3H_6$ gas, for example, a hydrocarbon gas such as an acetylene ($C_2H_2$) gas, an ethylene ($C_2H_4$) gas or the like.

Other Embodiments of the Present Disclosure

While one embodiment of the present disclosure has been specifically described above, the present disclosure is not limited to the aforementioned embodiment but may be differently modified without departing from the spirit of the present disclosure.

For example, there has been described an example in which, in the aforementioned embodiment and the modifications, a cycle of sequentially supplying the precursor, the borazine compound and the oxidizing agent is implemented a predetermined number of times, or an example in which, in the aforementioned embodiment and the modifications, a cycle of supplying the oxidizing agent after performing a set of sequentially supplying the precursor and the borazine compound a predetermined number of times is implemented a predetermined number of times. However, the present disclosure is not limited thereto and the supply order of the precursor, the borazine compound and the oxidizing agent can be arbitrarily changed. By changing the supply order, it is possible to change the quality or the composition ratio of the thin film as formed. Furthermore, as in the film formation sequence shown below, it is also possible to simultaneously supply the precursor, the borazine compound and the oxidizing agent in any combination, namely to mix them in any combination so as to be used. This makes it possible to change the quality or the composition ratio of the thin film as formed.

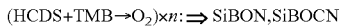
(HCDS+TMB→O₂)×n: ⇒ SiBON,SiBOCN

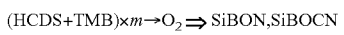
(HCDS+TMB)×m→O₂ ⇒ SiBON,SiBOCN

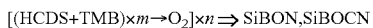
[(HCDS+TMB)×m→O₂]×n ⇒ SiBON,SiBOCN

In addition, for example, in the aforementioned embodiment, there has been described an example of using the TMB gas, which is an organic borazine-based gas, as the borazine-based gas. The present disclosure is not limited thereto. For example, as the borazine gas, it may be possible to use, for example, a borazine-based gas not containing C such as a borazine ($B_3H_6N_3$) gas, i.e., an inorganic borazine-based gas. In the film forming sequence illustrated in FIG. 4, when an inorganic borazine-based gas is used as the borazine-based gas, a film (SiBON film) containing a borazine ring skeleton and not containing C is formed as the second film. As a result, it is possible to appropriately reduce the C concentration in the film formed on the wafer 200.

By using a silicon-based insulating film, which is formed by the film forming sequence illustrated in FIG. 4 or the method of each of the modifications, as a sidewall spacer, it is possible to provide a technique of forming a device which is small in leak current and is superior in workability. Furthermore, by using the silicon-based insulating film mentioned above as an etch stopper, it is possible to provide a technique of forming a device which is superior in workability. In addition, according to the film forming sequence illustrated in FIG. 4 and some modifications, it is possible to form a silicon-based insulating film having an ideal stoichiometry without using plasma. Since the silicon-based insulating film can be formed without using plasma, it is also applicable to a process that concerns plasma damage, for example, an SADP film of DPT or the like.

The aforementioned film forming sequence may be suitably applicable to a case where a multi-element metal film containing a metal element such as titanium (Ti), zirconium (Zr), hafnium (Hf), tantalum (Ta), niobium (Nb), aluminum (Al), molybdenum (Mo), tungsten (W) or the like, and at least one specific element selected from a group consisting of B, O, C and N is formed on the wafer 200. That is, the present disclosure may be suitably applicable to, e.g., a case where a TiBON film, a TiBOCN film, a ZrBON film, a ZrBOCN film, an HfBON film, an HfBOCN film, a TaBON film, a TaBOCN film, an NbBON film, an NbBOCN film, an AlBON film, an AlBOCN film, an MoBON film, an MoBOCN film, a WBON film, or a WBOCN film is formed.

In these cases, as the precursor gas, it may be possible to use a precursor gas containing a metal element, instead of a precursor gas containing a semiconductor element such as Si or the like in the aforementioned embodiment. As the borazine compound and the oxidizing agent, it may be possible to respectively use the same gas as in the aforementioned embodiment. The processing procedures and processing conditions at this time may be similar to, for example, those of the aforementioned embodiment and modifications. Even in these cases, the same effects as those of the aforementioned embodiment and modifications may be achieved.

That is, the present disclosure may be suitably applicable to a case where a multi-element film containing at least one specific element selected from a group consisting of B, O, C and N and a predetermined element such as a semiconductor element or a metal element is formed.

Process recipes (programs describing processing procedures and processing conditions) used in these kinds of films may be prepared individually (prepared in a plural number) according to the contents of substrate processing (the kind, composition ratio, quality, film thickness, processing procedure and processing condition of the film as formed). Hereinafter, the process recipe may be simply referred to as a recipe. Moreover, at the start of substrate processing, it may properly select an appropriate recipe from the recipes according to the contents of substrate processing. Specifically, the various recipes, which are individually prepared according to the contents of substrate processing, may be stored in the memory device 121c included in the substrate processing device, via a telecommunication line or a recording medium storing the corresponding recipes (the external memory device 123). Further, at the start of substrate processing, the CPU 121a may properly select an appropriate recipe from the recipes stored in the memory device 121c according to the contents of substrate processing. With this configuration, it is possible for a single substrate processing apparatus to form films of different kinds, composition ratios, qualities and thicknesses for general purpose with enhanced reproducibility. In addition, it is possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. In the case of modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, for example, a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. Even in these cases, the processing procedures and the processing conditions may be similar to, for example, the processing procedures and the processing conditions of the aforementioned embodiment.

Figure 9A:
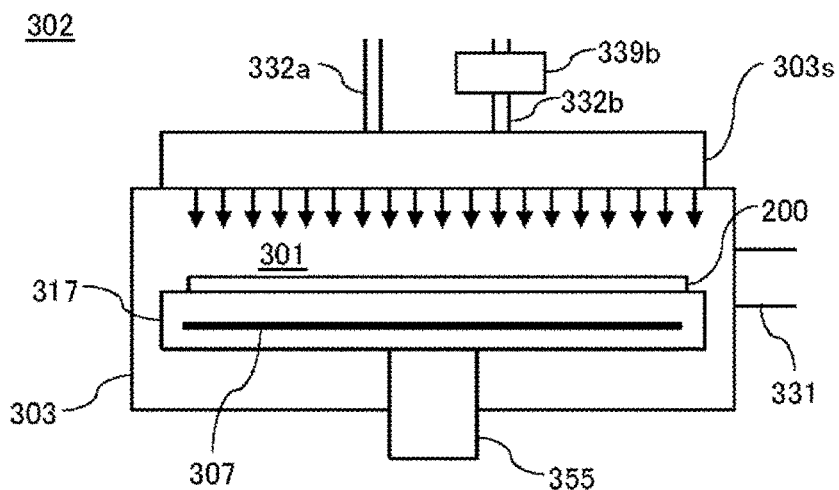
FIG. 9A is a schematic configuration diagram of a processing furnace of a substrate processing apparatus suitably used in another embodiment of the present disclosure, in which a portion of the processing furnace is shown in a vertical cross sectional view.

The present disclosure may be suitably applied to, for example, a case where a film is formed using a substrate processing apparatus provided with a processing furnace 302 illustrated in FIG. 9A. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the precursor gas mentioned above and a gas supply port 332b configured to supply the reaction gas mentioned above are connected to inlets (gas introduction holes) of the shower head 303s. A gas supply system similar to the precursor gas supply system of the aforementioned embodiment is connected to the gas supply port 332a. A remote plasma unit (plasma generation device) 339b as an excitation part for plasma-exciting and supplying the reaction gas mentioned above and a gas supply system similar to the reaction gas supply system of the aforementioned embodiment are connected to the gas supply port 332b. A gas distribution plate configured to supply a gas into the process chamber 301 in a shower-like manner is installed in outlets (gas discharge holes) of the shower head 303s. The shower head 303s is installed in such a position as to face the surfaces of the wafers 200 carried into the process chamber 301. An exhaust port 331 configured to evacuate the interior of the process chamber 301 is installed in the process vessel 303. An exhaust system similar to the exhaust system of the aforementioned embodiment is connected to the exhaust port 331.

Figure 9B:
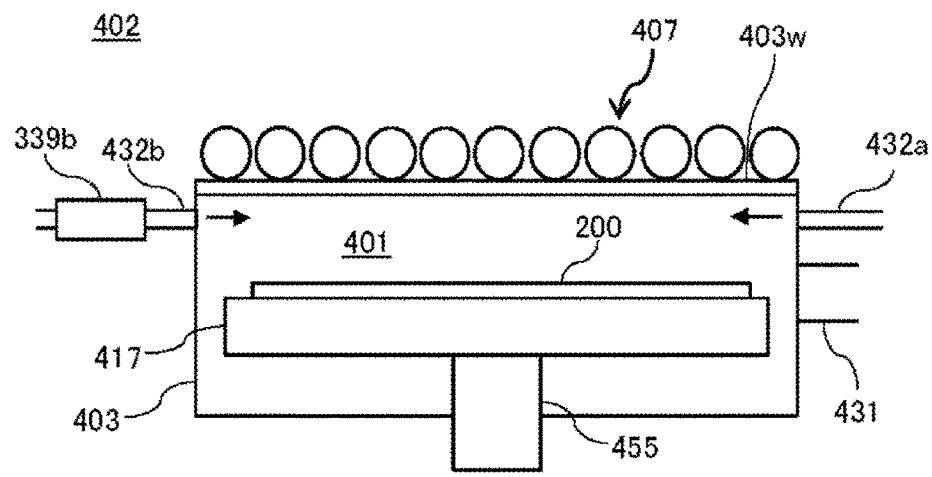
FIG. 9B is a schematic configuration diagram of a processing furnace of a substrate processing apparatus suitably used in yet another embodiment of the present disclosure, in which a portion of the processing furnace is shown in a vertical cross sectional view.

In addition, the present disclosure may be suitably applied to, e.g., a case where a film is formed using a substrate processing apparatus provided with a processing furnace 402 illustrated in FIG. 9B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 within the process vessel 403, and a quartz window 403w which transmits the light irradiated from the lamp heater 407. A gas supply port 432a configured to supply the precursor gas mentioned above and a gas supply port 432b as a gas supply part configured to supply the reaction gas mentioned above are connected to the process vessel 403. A gas supply system similar to the precursor gas supply system of the aforementioned embodiment is connected to the gas supply port 432a. The aforementioned remote plasma unit 339b and a gas supply system similar to the reaction gas supply system of the aforementioned embodiment are connected to the gas supply port 432b. The gas supply ports 432a and 432b are respectively installed at the lateral side of the end portions of the wafers 200 carried into the process chamber 401, namely at such positions as not to face the surfaces of the wafers 200 carried into the process chamber 401. An exhaust port 431 configured to exhaust the interior of the process chamber 401 is installed in the process vessel 403. An exhaust system similar to the exhaust system of the aforementioned embodiment is connected to the exhaust port 431.

In the case of using these substrate processing apparatuses, a film forming process may be performed by the sequences and processing conditions similar to those of the embodiment and modifications described above. Effects similar to those of the embodiment and modifications described above may be achieved.

The embodiment and modifications described above may be appropriately combined with one another. In addition, the processing conditions used at this time may be similar to, for example, the processing conditions of the aforementioned embodiment.

What is claimed is:

1. A method of manufacturing a semiconductor device, comprising:
   forming a film on a substrate by performing a cycle n times (where n is an integer equal to or greater than 1), the cycle including alternately performing:
      forming a first layer containing a borazine ring skeleton by performing a set m times (where m is an integer equal to or greater than 1), the set including:
         supplying a precursor to the substrate to form a precursor layer; and
         supplying a borazine compound containing the borazine ring skeleton to the precursor layer; and
      forming a second layer containing the borazine ring skeleton and oxygen by supplying an oxidizing agent to the first layer.

2. The method of claim 1, wherein the act of forming the film is performed under a condition in which a borazine ring skeleton in the borazine compound is maintained.

3. The method of claim 1, wherein the film is a film containing boron, nitrogen, oxygen, and an element contained in the precursor, or a film containing boron, nitrogen, oxygen, carbon and the element.

4. The method of claim 1, wherein m is 1 and n is an integer equal to or greater than 2.

5. The method of claim 1, wherein m is an integer equal to or greater than 2 and n is 1.

6. The method of claim 1, wherein m is an integer equal to or greater than 2 and n is an integer equal to or greater than 2.

7. The method of claim 1, wherein the borazine compound is an organic borazine compound, and
   wherein, in the act of performing the set m times, a first layer containing boron, nitrogen, oxygen, carbon and an element contained in the precursor is formed.

8. The method of claim 7, wherein, in the act of supplying the oxidizing agent, a second layer containing boron, nitrogen, oxygen, carbon and the element is formed by oxidizing and modifying the first layer under a condition in which the carbon contained in the first layer is not desorbed, and
   in the act of forming the film, a film containing boron, nitrogen, oxygen, carbon and the element is formed as the film.

9. The method of claim 7, wherein, in the act of supplying the oxidizing agent, a second layer containing boron, nitrogen, oxygen, carbon and the element is formed by thermally oxidizing and modifying the first layer, and
   in the act of forming the film, a film containing boron, nitrogen, oxygen, carbon and the element is formed as the film.

10. The method of claim 7, wherein, in the act of supplying the oxidizing agent, a second layer containing boron, nitrogen, oxygen and the element is formed by oxidizing and modifying the first layer under a condition in which the carbon contained in the first layer is desorbed, and
    in the act of forming the film, a film containing boron, nitrogen, oxygen and the element is formed as the film.

11. The method of claim 7, wherein, in the act of supplying the oxidizing agent, a second layer containing boron, nitrogen, oxygen and the element is formed by plasma-oxidizing and modifying the first layer, and in the act of forming the film, a film containing boron, nitrogen, oxygen and the element is formed as the film.

12. The method of claim 7, wherein, in the act of supplying the oxidizing agent, a second layer containing boron, nitrogen, oxygen and the element is formed by oxidizing and modifying the first layer using ozone as the oxidizing agent, and in the act of forming the film, a film containing boron, nitrogen, oxygen and the element is formed as the film.

13. The method of claim 7, wherein, in the act of supplying the oxidizing agent, a second layer containing boron, nitrogen, oxygen and the element is formed by oxidizing and modifying the first layer using atomic oxygen as the oxidizing agent, the atomic oxygen being generated through a reaction between an oxygen-containing gas and a hydrogen-containing gas at a pressure of less than an atmospheric pressure, and in the act of forming the film, a film containing boron, nitrogen, oxygen and the element is formed as the film.

14. A substrate processing apparatus, comprising:
    a process chamber configured to accommodate a substrate;
    a precursor supply system configured to supply a precursor to the substrate in the process chamber;
    a borazine compound supply system configured to supply a borazine compound to the substrate in the process chamber;

an oxidizing agent supply system configured to supply an oxidizing agent to the substrate in the process chamber; and a control part configured to control the precursor supply system, the borazine compound supply system, and the oxidizing agent supply system to perform the following in the process chamber:

forming a film on the substrate by performing a cycle n times (where n is an integer equal to or greater than 1), the cycle including alternately performing:

a first process of forming a first layer containing a borazine ring skeleton by performing a set m times (where m is an integer equal to or greater than 1), the set including:

supplying the precursor to the substrate to form a precursor layer; and supplying the borazine compound containing the borazine ring skeleton to the precursor layer; and a second process of forming a second layer containing the borazine ring skeleton and oxygen by supplying the oxidizing agent to the first layer.

15. A non-transitory computer-readable recording medium storing a program that causes a computer to perform a process, the process comprising:

forming a film on a substrate by performing a cycle n times (where n is an integer equal to or greater than 1), the cycle including alternately performing:

forming a first layer containing a borazine ring skeleton by performing a set m times (where m is an integer equal to or greater than 1), the set including:

supplying a precursor to the substrate to form a precursor layer; and supplying a borazine compound containing the borazine ring skeleton to the precursor layer; and forming a second layer containing the borazine ring skeleton and oxygen by supplying an oxidizing agent to the first layer.

* * * * *